(12) United States Patent
Tsuzuki et al.

(10) Patent No.: US 9,099,387 B2
(45) Date of Patent: *Aug. 4, 2015

(54) SEMICONDUCTOR DEVICE

(75) Inventors: Yukio Tsuzuki, Nukata-gun (JP); Makoto Asai, Kariya (JP)

(73) Assignee: DENSO CORPORATION, Kariya (JP)

( * ) Notice: Subject to any disclaimer, the term of this patent is extended or adjusted under 35 U.S.C. 154(b) by 300 days.

This patent is subject to a terminal disclaimer.

(21) Appl. No.: 13/171,115

(22) Filed: Jun. 28, 2011

(65) Prior Publication Data

US 2011/0254051 A1 Oct. 20, 2011

Related U.S. Application Data

(62) Division of application No. 12/213,469, filed on Jun. 19, 2008, now Pat. No. 7,999,314.

(30) Foreign Application Priority Data

Jun. 20, 2007 (JP) .................. 2007-162999
Jun. 11, 2008 (JP) .................. 2008-153327

(51) Int. Cl.
| | | |
|---|---|---|
| H01L 29/66 | (2006.01) | |
| H01L 29/06 | (2006.01) | |
| H01L 21/265 | (2006.01) | |
| H01L 29/10 | (2006.01) | |
| H01L 29/417 | (2006.01) | |
| H01L 29/739 | (2006.01) | |
| H01L 29/78 | (2006.01) | |

(52) U.S. Cl.
CPC ...... *H01L 21/26586* (2013.01); *H01L 29/1095* (2013.01); *H01L 29/41766* (2013.01); *H01L29/66727* (2013.01); *H01L 29/66734* (2013.01); *H01L 29/7397* (2013.01); *H01L 29/7806* (2013.01); *H01L 29/7813* (2013.01); *H01L 29/0619* (2013.01); *H01L 29/0696* (2013.01)

(58) Field of Classification Search
CPC .......... H01L 29/105; H01L 29/7802–29/7803; H01L 29/7813; H01L 27/0629; H01L 29/39; H01L 29/086; H01L 29/0847; H01L 27/0727; H01L 29/7804; H01L 29/36; H01L 29/0848; H01L 27/0664; H01L 27/075; H01L 29/41708; H01L 27/0761; H01L 27/0635; H01L 27/0647; H01L 27/0652; H01L 27/0716; H01L 27/0711; H01L 29/7805; H01L 27/102; H01L 27/1022; H01L 29/73; H01L 29/7302; H01L 29/732; H01L 29/739; H01L 29/7393; H01L 29/7395–29/7397; H01L 29/772; H01L 27/0207; H01L 27/10876; H01L 29/42356; H01L 29/42336; H01L 29/42352; H01L 29/66704; H01L 29/66734; H01L 29/7396
USPC .......................... 257/335, 341, 343, E29.027
See application file for complete search history.

(56) References Cited

U.S. PATENT DOCUMENTS

| | | | |
|---|---|---|---|
| 6,621,107 B2 | 9/2003 | Blanchard et al. | |
| 6,921,687 B2 * | 7/2005 | Hattori et al. ................ | 438/197 |
| 7,037,788 B2 * | 5/2006 | Ito et al. ....................... | 438/268 |
| 7,061,047 B2 | 6/2006 | Ono et al. | |
| 7,154,145 B2 | 12/2006 | Takahashi | |
| 7,230,297 B2 | 6/2007 | Ono et al. | |
| 7,498,634 B2 * | 3/2009 | Tsuzuki et al. ............... | 257/341 |
| 2004/0021174 A1 | 2/2004 | Kobayashi | |
| 2005/0017290 A1* | 1/2005 | Takahashi et al. ............ | 257/328 |
| 2005/0045960 A1* | 3/2005 | Takahashi ..................... | 257/368 |
| 2005/0218472 A1 | 10/2005 | Okada et al. | |
| 2006/0065925 A1 | 3/2006 | Yoshida | |
| 2006/0138535 A1 | 6/2006 | Ono et al. | |
| 2006/0209887 A1 | 9/2006 | Bhalla et al. | |
| 2006/0267090 A1 | 11/2006 | Sapp et al. | |
| 2007/0069287 A1 | 3/2007 | Takahashi | |
| 2007/0108468 A1 | 5/2007 | Takahashi | |
| 2007/0170549 A1 | 7/2007 | Tsuzuki et al. | |
| 2007/0194372 A1 | 8/2007 | Ono et al. | |
| 2008/0135871 A1* | 6/2008 | Ruething et al. ............. | 257/139 |

FOREIGN PATENT DOCUMENTS

| | | |
|---|---|---|
| JP | A-62-123771 | 6/1987 |
| JP | A-06-196705 | 7/1994 |
| JP | A-09-148577 | 6/1997 |

OTHER PUBLICATIONS

Office Action mailed Dec. 1, 2009 from the Japan Patent Office for Patent Application No. JP 2008-153327 (English translation enclosed) corresponding to U.S. Appl. No. 12/213,469.

Office Action mailed Aug. 11, 2010 from U.S. Appl. No. 12/213,469.

Final Office Action mailed Nov. 15, 2010 from U.S. Appl. No. 12/213,469.

Notice of Allowance mailed Apr. 20, 2011 from U.S. Appl. No. 12/213,469.

* cited by examiner

*Primary Examiner* — Phat X Cao
*Assistant Examiner* — Diana C Vieira
(74) *Attorney, Agent, or Firm* — Posz Law Group, PLC

(57) ABSTRACT

A semiconductor device includes an n-conductive type semiconductor substrate having a main side and a rear side, a p-conductive type layer arranged over the main side of the substrate, a main side n-conductive type region arranged in the p-conductive type layer, a rear side n-conductive type layer arranged over the rear side of the substrate, a first trench which reaches the substrate and penetrates the main side n-conductive type region and the p-conductive type layer, a second trench which reaches an inside of the p-conductive type layer, a second electrode layer, which is embedded in the second trench and connected to the p-conductive type layer. Hereby, the semiconductor device, in which the recovery property of a diode cell can be improved without damaging the property of a MOS transistor cell or an IGBT cell and the surge withstand property does not deteriorate, can be obtained.

4 Claims, 12 Drawing Sheets

FIG. 6

| | | |
|---|---|---|
| PLANAR STRUCTURE | VB ↓ ↓ VB | VA ↓ ↓ VA |
| SIDE SURFACE CROSS SECTIONAL STRUCTURE | | |
| P+ CONTACT RESISTANCE | 20000 [Ω·μm²] | 70 [Ω·μm²] |
| BREAKING ENERGY RATIO | 1 | GREATER THAN 3 |

SEMICONDUCTOR DEVICE

CROSS REFERENCE TO RELATED APPLICATIONS

The present application is a divisional of U.S. application Ser. No. 12/213,469 filed on Jun. 19, 2008, which is based on and claims priority to Japanese Patent Application No. 2007-162999 filed on Jun. 20, 2007 and Japanese Patent Application No. 2008-153327 filed on Jun. 11, 2008, the disclosures of which are incorporated herein by reference.

FIELD OF THE INVENTION

The present invention relates to a semiconductor device having a semiconductor substrate, in which a MOS transistor cell or an IGBT cell functioning as a switching element and a diode cell functioning as a free wheel diode are arranged, and a manufacturing method thereof.

BACKGROUND OF THE INVENTION

An inverter circuit for driving a load such as a motor is a switching equipment between direct current and alternating current, converts the direct current to the alternating current and feeds the alternating current voltage into the motor as the load. The inverter circuit for driving an inductive motor includes a MOS transistor as a switching element and a free wheel diode. The MOS transistor is used as the switching element and the free wheel diode functions that current flowing in the motor does not change due to the switching of the MOS transistor by bypassing the current flowing in the motor at the off-state of the MOS transistor. Hereinafter, although the switching element will be described by using the MOS transistor, but the switching element may be an insulated gate bipolar transistor (IGBT).

FIG. 15 is a cross sectional view of a semiconductor device 90. The semiconductor device 90 is used for the above-mentioned inverter circuit for driving a load such as a motor, and is an example of a semiconductor device including a MOS transistor cell and a diode cell, which are provided over the same substrate. It is shown by the inventors as a comparative example of the present disclosure. In addition, FIG. 16 is an equivalent circuit diagram of the semiconductor device 90 shown in FIG. 15.

In the semiconductor device 90 shown in FIG. 15, a p-conductive type (P) layer 2 is formed over a surface portion on a main side of an n-conductive type (N−) semiconductor substrate 1, and a main side n-conductive type (N+) region 3 having an impurity at high concentration and a main side high concentration p-conductive type (P+) region 4 are formed in a surface portion of the p-conductive type layer 2. Moreover, a rear side n-conductive type (N+) region 6 is formed over a surface portion on a rear side of the n-conductive type semiconductor substrate 1.

In the semiconductor device 90 shown in FIG. 15, a first trench T1 which reaches the n-conductive type semiconductor substrate 1 is formed to penetrate the main side n-conductive type region 3 and the p-conductive type layer 2.

In the semiconductor device 90 shown in FIG. 15, a first electrode layer 8 made of polysilicon or the like, which is embedded in the first trench T1 through an insulating film 7 formed over a sidewall, provides a gate electrode of a MOS transistor cell 90t. A second electrode layer 10 made of aluminum or the like is formed over the main side of the n-conductive type semiconductor substrate 1 through an interlayer insulating film 9. The second electrode layer 10 is electrically coupled with the p-conductive type layer 2 through the main side n-conductive type region 3 and the main side p-conductive type region 4, and provides a source electrode of the MOS transistor cell 90t and an anode electrode of a diode cell 90d. Moreover, a third electrode layer 11, which is formed over the rear side surface of the n-conductive type semiconductor substrate 1 and being electrically coupled with the rear side n-conductive type region 6, provides a drain electrode of the MOS transistor 90t and a cathode electrode of the diode cell 90d.

In other words, in the semiconductor device 90, the main side n-conductive type region 3 is a source region of the MOS transistor cell 90t, the p-conductive type layer 2 is a channel forming layer of the MOS transistor cell 90t, and the rear side n-conductive type region 6 is a drain region of the MOS transistor cell 90t. Moreover, an interface between the n-conductive type semiconductor substrate 1 and the p-conductive type layer 2 is a PN junction surface of the diode cell 90d, the main side p-conductive type region 4 is an anode region of the diode cell 90d, and the rear side n-conductive type region 6 is a cathode region of the diode cell 90d. Therefore, as shown by the equivalent circuit diagram in FIG. 16, in the semiconductor device 90, the MOS transistor cell 90t and the diode cell 90d are connected in parallel to each other.

In case that the diode cell 90d of the semiconductor device 90 in FIG. 15 is used as the above-mentioned free wheel diode of the inverter circuit, the current waveform at reverse recovery step of the diode is important when the diode is switched from on-state to off-state.

FIG. 18A is a circuit diagram for measuring and evaluating a current waveform of the current flowing in the diode cell 90d of the semiconductor device 90 shown in FIG. 15, and FIG. 18B is a diagram showing an example of a current waveform.

Semiconductor devices 90a and 90b in the measuring circuit diagram of FIG. 18A have the same structure as the semiconductor device 90 shown in FIG. 15. A MOS transistor 90 at of the semiconductor device 90a is used as a switching element, and the waveform of the current Id flowing in a diode 90bd is measured by short-circuiting the MOS transistor of the semiconductor device 90b.

As shown in FIG. 18B, when the MOS transistor 90 at of the semiconductor device 90a is in an off-state, circulation current Iif flows in the diode 90bd of the semiconductor device 90b. The MOS transistor 90 at of the semiconductor device 90a is switched to be in an on-state, current flows instantaneously in a reverse direction in the diode 90bd of the semiconductor device 90b. The peak value of the current flowing in the reverse direction is defined as the recovery current Irr. In addition, at the reverse recovery step, in which the recovery current is small, the diode is applied supply voltage. The product of the current and the voltage is defined as the recovery loss. Generally, it is required for a rectifier diode to have a small recovery current Irr, small recovery loss at the reverse recovery step, and gradual recovery of the current at the reverse recovery step.

In the semiconductor device 90 shown in FIG. 15, the diode cell 90d provided with the MOS transistor 90t, in which the interface between the p-conductive type layer 2 of the MOS transistor cell 90t and the n-conductive type semiconductor substrate 1 provides the PN junction surface, operates as a free wheel diode. In the diode cell 90d of the semiconductor device 90, the concentration of the p-conductive type layer 2 which configures the diode becomes high as compared with a common high-speed recovery diode. Thus, holes are injected at high concentration when the diode cell 90d is at the forward operation and the recovery current Irr becomes large at the recovery operation. Therefore, the recovery property becomes worse.

In order to improve the recovery property of the diode, a method that a surface pattern, a concentration profile of an impurity and lifetime or the like are optimized can be applied to a single high-speed diode. However, in the diode cell 90d of the semiconductor device 90, which is provided with the MOS transistor cell 90t, modification for improving the performance of the diode cell 90d may impair the performance of the MOS transistor cell 90t. Therefore, the above-mentioned method can not be applied.

A structure of a semiconductor device for improving the recovery property is disclosed in JP-A-2005-101514.

FIG. 17 is a view showing a commonly known structure including the structure of a semiconductor device disclosed in JP-A-2005-101514 and a cross sectional view of a semiconductor device 91. In the semiconductor device 91 of FIG. 17, with respect to the same component with one included in the semiconductor device 90 of FIG. 15, the same reference numerals are applied.

In the semiconductor device 91 shown in FIG. 17, a channel forming region of a MOS transistor cell 91t is formed by a p-conductive type region 2w which is laterally diffused, and a PN junction surface of a diode cell 91d is used as an interface of an n-conductive type (N−) semiconductor substrate 1 in vicinity of an end portion of the p-conductive type region 2w which is laterally diffused in a lateral direction. Since the impurity concentration in the vicinity of the end portion of the p-conductive type region 2w, which is laterally diffused in the lateral direction, is low, a concentration of injected holes is decreased when the diode cell 91d is at the forward operation, so that the recovery property is improved.

Unlike the semiconductor device 90 shown in FIG. 15, the main side p-conductive type (P+) region 4 is not formed in the semiconductor device 91 shown in FIG. 17. Moreover, an impurity concentration of a surface of the p-conductive type region 2w, which is laterally diffused of the semiconductor device 91 in FIG. 17, is low compared to the p-conductive type layer 2 of the semiconductor device 90 shown in FIG. 15. Therefore, in the semiconductor device 91 of FIG. 17, a pinch resistance of a channel P (the p-conductive type region 2w), which is a base resistance of a parasitic NPN transistor structured by the main side n-conductive type (N+) region 3, the p-conductive type region 2w and the n-conductive type semiconductor substrate 1, becomes large. As a result, since a current amplification factor of the parasitic NPN transistor becomes large, when a high voltage surge is applied to the semiconductor device 91 and an avalanche current flows in the p-conductive type region 2w, the parasitic NPN transistor is easy to operate and the semiconductor device 91 is broken by the high voltage surge. That is, although the recovery property of the diode cell 91d of the semiconductor device 91 in FIG. 17 is improved, a breaking energy becomes very small and a surge withstand property becomes low.

SUMMARY OF THE INVENTION

In a semiconductor device including a MOS transistor cell or an IGBT cell and a diode cell over a same semiconductor substrate, it is an object of the present disclosure to provide the semiconductor device, in which recovery property of the diode cell can be improved without damaging the property of the MOS transistor cell or the property of the IGBT cell and the surge withstand property does not deteriorate, and a manufacturing method thereof.

According to a first aspect of the present disclosure, a semiconductor device includes an n-conductive type semiconductor substrate having a main side and a rear side, and including a trench type MOS transistor cell and a diode cell; a p-conductive type layer arranged over a main side surface portion of the n-conductive type semiconductor substrate, and having an impurity concentration which decreases from the main side toward the rear side; a main side n-conductive type region arranged over a surface portion of the p-conductive type layer; a rear side n-conductive type layer arranged over a rear side surface portion of the n-conductive type semiconductor substrate; a first trench which reaches the n-conductive type semiconductor substrate and penetrates the main side n-conductive type region and the p-conductive type layer; a first electrode layer embedded in the first trench through an insulating film, and providing a gate electrode of the trench type MOS transistor cell; a second electrode layer arranged over the main side of the n-conductive type semiconductor substrate, electrically coupled with the main side n-conductive type region and the p-conductive type layer, and providing both a source electrode of the trench type MOS transistor cell and an anode electrode of the diode cell; a third electrode layer arranged over the rear side of the n-conductive type semiconductor substrate, electrically coupled with the rear side n-conductive type layer, and providing both a drain electrode of the trench type MOS transistor cell and a cathode electrode of the diode cell; and a second trench which reaches an inside of the p-conductive type layer. The second electrode layer is embedded in the second trench, and the second electrode layer is electrically coupled with the p-conductive type layer.

According to the above configuration, the semiconductor device, in which the recovery property of the diode cell can be improved without damaging the property of the MOS transistor cell and the surge withstand property does not deteriorate, can be obtained.

According to a second aspect of the present disclosure, the semiconductor device further includes a main side p-conductive type region arranged in a surface portion of the p-conductive type layer, the second trench penetrates the main side p-conductive type region, the second electrode layer is electrically coupled with the main side p-conductive type region at a sidewall of the second trench, electrical connection between the second electrode layer and the main side p-conductive type region is ohmic contact, and a contact portion of the main side p-conductive type region which contacts the second electrode layer has a p-conductive type impurity concentration higher than a portion of the main side p-conductive type region other than the contact portion. A manufacturing method of such the semiconductor device includes implanting an ion on the main side of the n-conductive type semiconductor substrate with a predetermined angle so that the contact portion of the main side p-conductive type region has the impurity concentration higher than the portion of the main side p-conductive type region.

According to the above manufacturing method, the semiconductor device, in which the recovery property of the diode cell can be improved without damaging the property of the MOS transistor cell and the surge withstand property does not deteriorate, can be obtained.

According to a third aspect of the present disclosure, further in the semiconductor device of the first aspect, electrical connection between the second electrode layer and the p-conductive type layer at least at a bottom of the second trench is schottky contact, a barrier film is arranged between the second electrode layer and the p-conductive type layer, the barrier film is arranged between the second electrode layer and the p-conductive type layer at the bottom of the second trench, and the barrier film is not arranged between the second electrode layer and the p-conductive type layer at a sidewall of the second trench so that the second electrode layer contacts the p-conductive type layer directly. A manufacturing method of such the semiconductor device includes arranging the second trench in the n-conductive type semiconductor substrate, arranging the barrier film at the bottom of the second trench after the arranging the second trench without arranging the barrier film at the sidewall of the second trench by sputtering, and performing a thermal treatment under a predetermined temperature after the second electrode layer is embedded in the second trench in which the barrier film is arranged.

According to the above manufacturing method, the semiconductor device, in which the recovery property of the diode cell can be improved without damaging the property of the MOS transistor cell and the surge withstand property does not deteriorate, can be obtained.

According to a fourth aspect of the present disclosure, a manufacturing method of the semiconductor device of the first aspect includes removing a damage layer generated in vicinity of the second trench when the second trench is arranged in the p-conductive type layer.

According to the above manufacturing method, the semiconductor device, in which the recovery property of the diode cell can be improved without damaging the property of the MOS transistor cell and the surge withstand property does not deteriorate, can be obtained.

According to a fifth aspect of the present disclosure, a semiconductor device includes an n-conductive type semiconductor substrate having a main side and a rear side, and including a planar type MOS transistor cell and a diode cell; a p-conductive type layer arranged over a main side surface portion of the n-conductive type semiconductor substrate, and having an impurity concentration which decreases from the main side toward the rear side; a main side n-conductive type region arranged over a surface portion of the p-conductive type layer; a rear side n-conductive type layer arranged over a rear side surface portion of the n-conductive type semiconductor substrate; an insulating film arranged over a main side surface of the n-conductive type semiconductor substrate, and contacting the main side n-conductive type region, the p-conductive type layer and a portion of the substrate in which the p-conductive type layer is not arranged; a first electrode layer arranged at a surface of the insulating film, and providing a gate electrode of the planar type MOS transistor cell; a second electrode layer arranged over the main side of the n-conductive type semiconductor substrate, electrically coupled with the main side n-conductive type region and the p-conductive type layer, and providing both a source electrode of the planar type MOS transistor cell and an anode electrode of the diode cell; a third electrode layer arranged over the rear side of the n-conductive type semiconductor substrate, electrically coupled with the rear side n-conductive type layer, and providing both a drain electrode of the planar type MOS transistor cell and a cathode electrode of the diode cell; and a trench reaching an inside of the p-conductive type layer. The second electrode layer is embedded in the trench, and the second electrode layer is electrically coupled with the p-conductive type layer.

According to the above configuration, the semiconductor device, in which the recovery property of the diode cell can be improved without damaging the property of the MOS transistor cell and the surge withstand property does not deteriorate, can be obtained.

According to a sixth aspect of the present disclosure, a semiconductor device includes a p-conductive type semiconductor substrate having a main side and a rear side, and including a trench type MOS transistor cell and a diode cell; an n-conductive type layer arranged over a main side surface portion of the p-conductive type semiconductor substrate, and having an impurity concentration which decreases from the main side toward the rear side; a main side p-conductive type region arranged over a surface portion of the n-conductive type layer; a rear side p-conductive type layer arranged over a rear side surface portion of the p-conductive type semiconductor substrate; a first trench which reaches the p-conductive type semiconductor substrate and penetrates the main side p-conductive type region and the n-conductive type layer; a first electrode layer embedded in the first trench through an insulating film, and providing a gate electrode of the trench type MOS transistor cell; a second electrode layer arranged over the main side of the p-conductive type semiconductor substrate, electrically coupled with the main side p-conductive type region and the n-conductive type layer, and providing both a source electrode of the trench type MOS transistor cell and an anode electrode of the diode cell; a third electrode layer arranged over the rear side of the p-conductive type semiconductor substrate, electrically coupled with the rear side p-conductive type layer, and providing both a drain electrode of the trench type MOS transistor cell and a cathode electrode of the diode cell; and a second trench which reaches an inside of the n-conductive type layer. The second electrode layer is embedded in the second trench, and the second electrode layer is electrically coupled with the n-conductive type layer.

According to the above configuration, the semiconductor device, in which the recovery property of the diode cell can be improved without damaging the property of the MOS transistor cell and the surge withstand property does not deteriorate, can be obtained.

According to a seventh aspect of the present disclosure, the semiconductor device of the sixth aspect further includes a main side n-conductive type region arranged in a surface portion of the n-conductive type layer, the second trench penetrates the main side n-conductive type region, the second electrode layer is electrically coupled with the main side n-conductive type region at a sidewall of the second trench, electrical connection between the second electrode layer and the main side n-conductive type region is ohmic contact, and a contact portion of the main side n-conductive type region which contacts the second electrode layer has an n-conductive type impurity concentration higher than a portion of the main side n-conductive type region other than the contact portion. A manufacturing method of such the semiconductor device includes implanting an ion on the main side of the p-conductive type semiconductor substrate with a predetermined angle so that the contact portion of the main side n-conductive type region has the impurity concentration higher than the portion of the main side n-conductive type region.

According to the above manufacturing method, the semiconductor device, in which the recovery property of the diode cell can be improved without damaging the property of the MOS transistor cell and the surge withstand property does not deteriorate, can be obtained.

According to an eighth aspect of the present disclosure, further in the semiconductor device of the sixth aspect, electrical connection between the second electrode layer and the n-conductive type layer at least at a bottom of the second trench is schottky contact, a barrier film is arranged between the second electrode layer and the n-conductive type layer, the barrier film is arranged between the second electrode layer and the n-conductive type layer at the bottom of the second trench, and the barrier film is not arranged between the second electrode layer and the n-conductive type layer at a sidewall of the second trench so that the second electrode layer contacts the n-conductive type layer directly. A manufacturing method of such the semiconductor device includes arranging the second trench in the p-conductive type semiconductor substrate; arranging the barrier film at the bottom of the second trench after the arranging the second trench without arranging the barrier film at the sidewall of the second trench by sputtering; and performing a thermal treatment under a predetermined temperature after the second electrode layer is embedded in the second trench in which the barrier film is arranged.

According to the above manufacturing method, the semiconductor device, in which the recovery property of the diode cell can be improved without damaging the property of the MOS transistor cell and the surge withstand property does not deteriorate, can be obtained.

According to a ninth aspect of the present disclosure, a manufacturing method of the semiconductor device of the sixth aspect includes removing a damage layer generated in vicinity of the second trench when the second trench is arranged in the n-conductive type layer, arranging the second trench in the p-conductive type semiconductor substrate, and removing the damage layer generated in the vicinity of the second trench by dry etching after arranging the second trench.

According to the above manufacturing method, the semiconductor device, in which the recovery property of the diode cell can be improved without damaging the property of the MOS transistor cell and the surge withstand property does not deteriorate, can be obtained.

According to a tenth aspect of the present disclosure, a semiconductor device includes a p-conductive type semiconductor substrate having a main side and a rear side, and including a planar type MOS transistor cell and a diode cell; an n-conductive type layer arranged over a main side surface portion of the p-conductive type semiconductor substrate, and having an impurity concentration decreases from the main side toward the rear side; a main side p-conductive type region arranged over a surface portion of the n-conductive type layer; a rear side p-conductive type layer arranged over a rear side surface portion of the p-conductive type semiconductor substrate; an insulating film arranged over a main side surface of the p-conductive type semiconductor substrate, and contacting the main side p-conductive type region, the n-conductive type layer and a portion of the substrate in which the n-conductive type layer is not arranged; a first electrode layer arranged at a surface of the insulating film, and providing a gate electrode of the planar type MOS transistor cell; a second electrode layer arranged over the main side of the p-conductive type semiconductor substrate, electrically coupled with the main side p-conductive type region and the n-conductive type layer, and providing both a source electrode of the planar type MOS transistor cell and an anode electrode of the diode cell; a third electrode layer arranged over the rear side of the p-conductive type semiconductor substrate, electrically coupled with the rear side p-conductive type layer, and providing both a drain electrode of the planar type MOS transistor cell and a cathode electrode of the diode cell; and a trench reaching an inside of the n-conductive type layer. The second electrode layer is embedded in the trench, and the second electrode layer is electrically coupled with the n-conductive type layer.

According to the above configuration, the semiconductor device, in which the recovery property of the diode cell can be improved without damaging the property of the MOS transistor cell and the surge withstand property does not deteriorate, can be obtained.

According to an eleventh aspect of the present disclosure, a semiconductor device includes an n-conductive type semiconductor substrate having a main side and a rear side, and including an IGBT cell and a diode cell; a p-conductive type layer arranged over a main side surface portion of the n-conductive type semiconductor substrate, and having an impurity concentration which decreases from the main side toward the rear side; a main side n-conductive type region and a main side p-conductive type region arranged over a surface portion of the p-conductive type layer; a rear side p-conductive type region and a rear side n-conductive type region arranged over a rear side surface portion of the n-conductive type semiconductor substrate; a first trench which reaches the n-conductive type semiconductor substrate and penetrates the main side n-conductive type region and the p-conductive type layer; a first electrode layer embedded in the first trench through an insulating film, and providing a gate electrode of the IGBT cell; a second electrode layer arranged over the main side of the n-conductive type semiconductor substrate, electrically coupled with the main side n-conductive type region and the p-conductive type layer, and providing both an emitter electrode of the IGBT cell and an anode electrode of the diode cell; a third electrode layer arranged over the rear side of the n-conductive type semiconductor substrate, electrically coupled with the rear side p-conductive type region and the rear side n-conductive type region, and providing both a collector electrode of the IGBT cell and a cathode electrode of the diode cell; and a second trench which reaches an inside of the p-conductive type layer and penetrates the main side p-conductive type region. The second electrode layer is embedded in the second trench, and a contact portion of the main side p-conductive type region which contacts the second electrode layer has a p-conductive type impurity concentration higher than a portion of the main side p-conductive type region other than the contact portion so that the second electrode layer is electrically coupled with the main side p-conductive type region by ohmic contact at a sidewall of the second trench.

According to the above configuration, the semiconductor device, in which the recovery property of the diode cell can be improved without damaging the property of the IGBT cell and the surge withstand property does not deteriorate, can be obtained.

According to an twelfth aspect of the present disclosure, further in the semiconductor device of the eleventh aspect, a barrier film is arranged between the second electrode layer and the p-conductive type layer at a bottom of the second trench, and the barrier film is not arranged between the second electrode layer and the p-conductive type layer at the sidewall of the second trench so that the second electrode layer contacts the p-conductive type layer directly. A manufacturing method of such the semiconductor device includes arranging the second trench in the n-conductive type semiconductor substrate; arranging the barrier film at the bottom of the second trench after the arranging the second trench without arranging the barrier film at the sidewall of the second trench by sputtering; and performing a thermal treatment under a predetermined temperature after the second electrode layer is embedded in the second trench in which the barrier film is arranged.

According to the above manufacturing method, the semiconductor device, in which the recovery property of the diode cell can be improved without damaging the property of the IGBT cell and the surge withstand property does not deteriorate, can be obtained.

According to a thirteenth aspect of the present disclosure, a manufacturing method of the semiconductor device of the eleventh aspect includes implanting an ion on the main side of the n-conductive type semiconductor substrate with a predetermined angle so that the contact portion of the main side p-conductive type region has the impurity concentration higher than the portion of the main side p-conductive type region.

According to the above manufacturing method, the semiconductor device, in which the recovery property of the diode cell can be improved without damaging the property of the IGBT cell and the surge withstand property does not deteriorate, can be obtained.

According to a fourteenth aspect of the present disclosure, a manufacturing method of the semiconductor device of the eleventh aspect includes arranging the second trench in the n-conductive type semiconductor substrate, and removing a damage layer generated in vicinity of the second trench by dry etching after arranging the second trench.

According to the above manufacturing method, the semiconductor device, in which the recovery property of the diode cell can be improved without damaging the property of the IGBT cell and the surge withstand property does not deteriorate, can be obtained.

According to a fifteenth aspect of the present disclosure, a semiconductor device includes an n-conductive type semiconductor substrate having a main side and a rear side, and including an IGBT cell and a diode cell; a p-conductive type layer arranged over a main side surface portion of the n-conductive type semiconductor substrate, and having an impurity concentration which decreases from the main side toward the rear side; a main side n-conductive type region and a main side p-conductive type region arranged over a surface portion of the p-conductive type layer; a rear side p-conductive type region and a rear side n-conductive type region arranged over a rear side surface portion of the n-conductive type semiconductor substrate; a first trench which reaches the n-conductive type semiconductor substrate and penetrates the main side n-conductive type region and the p-conductive type layer; a first electrode layer embedded in the first trench through an insulating film, and providing a gate electrode of the IGBT cell; a second electrode layer arranged over the main side of the n-conductive type semiconductor substrate, electrically coupled with the main side n-conductive type region and the p-conductive type layer, and providing both an emitter electrode of the IGBT cell and an anode electrode of the diode cell; a third electrode layer arranged over the rear side of the n-conductive type semiconductor substrate, electrically coupled with the rear side p-conductive type region and the rear side n-conductive type region, and providing both a collector electrode of the IGBT cell and a cathode electrode of the diode cell; an exposed surface which is exposed at the main side of the n-conductive type semiconductor substrate and an unexposed surface which is not exposed at the main side of the n-conductive type semiconductor substrate in the main side p-conductive type region; and a second trench which reaches an inside of the p-conductive type layer and penetrates the main side p-conductive type region. The second electrode layer is embedded in the second trench and the second electrode layer is electrically coupled with the unexposed surface of the main side p-conductive type region at a sidewall of the second trench, and the second electrode layer is electrically coupled with the exposed surface of the main side p-conductive type region at the main side of the n-conductive type semiconductor substrate.

According to the above configuration, the semiconductor device, in which the recovery property of the diode cell can be improved without damaging the property of the IGBT cell and the surge withstand property does not deteriorate, can be obtained.

According to a sixteenth aspect of the present disclosure, a semiconductor device includes a p-conductive type semiconductor substrate having a main side and a rear side, and including an IGBT cell and a diode cell; an n-conductive type layer arranged over a main side surface portion of the p-conductive type semiconductor substrate, and having an impurity concentration which decreases from the main side toward the rear side; a main side p-conductive type region and a main side n-conductive type region arranged over a surface portion of the n-conductive type layer, a rear side n-conductive type region and a rear side p-conductive type region arranged over a rear side surface portion of the p-conductive type semiconductor substrate; a first trench which reaches the p-conductive type semiconductor substrate and penetrates the main side p-conductive type region and the n-conductive type layer; a first electrode layer embedded in the first trench through an insulating film, and providing a gate electrode of the IGBT cell; a second electrode layer arranged over the main side of the p-conductive type semiconductor substrate, electrically coupled with the main side p-conductive type region and the n-conductive type layer, and providing both an emitter electrode of the IGBT cell and an anode electrode of the diode cell; a third electrode layer arranged over the rear side of the p-conductive type semiconductor substrate, electrically coupled with the rear side n-conductive type region and the rear side p-conductive type region, and providing both a collector electrode of the IGBT cell and a cathode electrode of the diode cell; and a second trench which reaches an inside of the n-conductive type layer and penetrates the main side n-conductive type region. The second electrode layer is embedded in the second trench, and a contact portion of the main side n-conductive type region which contacts the second electrode layer has an n-conductive type impurity concentration higher than a portion of the main side n-conductive type region other than the contact portion so that the second electrode layer is electrically coupled with the main side n-conductive type region by ohmic contact at a sidewall of the second trench.

According to the above configuration, the semiconductor device, in which the recovery property of the diode cell can be improved without damaging the property of the IGBT cell and the surge withstand property does not deteriorate, can be obtained.

According to a seventeenth aspect of the present disclosure, further in the semiconductor device of the sixteenth aspect, a barrier film is arranged between the second electrode layer and the n-conductive type layer at a bottom of the second trench, and the barrier film is not arranged between the second electrode layer and the n-conductive type layer at the sidewall of the second trench so that the second electrode layer contacts the n-conductive type layer directly. A manufacturing method of such the semiconductor device includes arranging the second trench in the p-conductive type semiconductor substrate; arranging the barrier film at the bottom of the second trench after the arranging the second trench without arranging the barrier film at the sidewall of the second trench by sputtering; and performing a thermal treatment under a predetermined temperature after the second electrode layer is embedded in the second trench in which the barrier film is arranged.

According to the above manufacturing method, the semiconductor device, in which the recovery property of the diode cell can be improved without damaging the property of the IGBT cell and the surge withstand property does not deteriorate, can be obtained.

According to a eighteenth aspect of the present disclosure, a manufacturing method of the semiconductor device of the sixteenth aspect includes implanting an ion on the main side of the p-conductive type semiconductor substrate with a predetermined angle so that the contact portion of the main side n-conductive type region has the impurity concentration higher than the portion of the main side n-conductive type region.

According to the above manufacturing method, the semiconductor device, in which the recovery property of the diode cell can be improved without damaging the property of the IGBT cell and the surge withstand property does not deteriorate, can be obtained.

According to a nineteenth aspect of the present disclosure, a manufacturing method of the semiconductor device of the sixteenth aspect includes arranging the second trench in the p-conductive type semiconductor substrate, and removing a damage layer generated in vicinity of the second trench by dry etching after arranging the second trench.

According to the above manufacturing method, the semiconductor device, in which the recovery property of the diode cell can be improved without damaging the property of the IGBT cell and the surge withstand property does not deteriorate, can be obtained.

According to a twentieth aspect of the present disclosure, a semiconductor device includes a p-conductive type semiconductor substrate having a main side and a rear side, and including an IGBT cell and a diode cell; an n-conductive type layer arranged over a main side surface portion of the p-conductive type semiconductor substrate, and having an impurity concentration which decreases from the main side toward the rear side; a main side p-conductive type region and a main side n-conductive type region arranged over a surface portion of the n-conductive type layer; a rear side n-conductive type region and a rear side p-conductive type region arranged over a rear side surface portion of the p-conductive type semiconductor substrate; a first trench which reaches the p-conductive type semiconductor substrate and penetrates the main side p-conductive type region and the n-conductive type layer; a first electrode layer embedded in the first trench through an insulating film, and providing a gate electrode of the IGBT cell; a second electrode layer arranged over the main side of the p-conductive type semiconductor substrate, electrically coupled with the main side p-conductive type region and the n-conductive type layer, and providing both an emitter electrode of the IGBT cell and an anode electrode of the diode cell; a third electrode layer arranged over the rear side of the p-conductive type semiconductor substrate, electrically coupled with the rear side n-conductive type region and the rear side p-conductive type region, and providing both a collector electrode of the IGBT cell and a cathode electrode of the diode cell; an exposed surface which is exposed at the main side of the p-conductive type semiconductor substrate and an unexposed surface which is not exposed at the main side of the p-conductive type semiconductor substrate in the main side n-conductive type region; and a second trench which reaches an inside of the n-conductive type layer and penetrates the main side n-conductive type region. The second electrode layer is embedded in the second trench and the second electrode layer is electrically coupled with the unexposed surface of the main side n-conductive type region at a sidewall of the second trench, and the second electrode layer is electrically coupled with the exposed surface of the main side n-conductive type region at the main side of the p-conductive type semiconductor substrate.

According to the above configuration, the semiconductor device, in which the recovery property of the diode cell can be improved without damaging the property of the IGBT cell and the surge withstand property does not deteriorate, can be obtained.

BRIEF DESCRIPTION OF THE DRAWINGS

The above and other objects, features and advantages of the present invention will become more apparent from the following detailed description made with reference to the accompanying drawings. In the drawings:

FIG. 6 shows a diagram showing comparisons between a cross sectional side structure shown in FIG. 5A and a cross sectional side structure shown in FIG. 5B;

DETAILED DESCRIPTION OF THE PREFERRED EMBODIMENTS

First Embodiment

Figure 1:
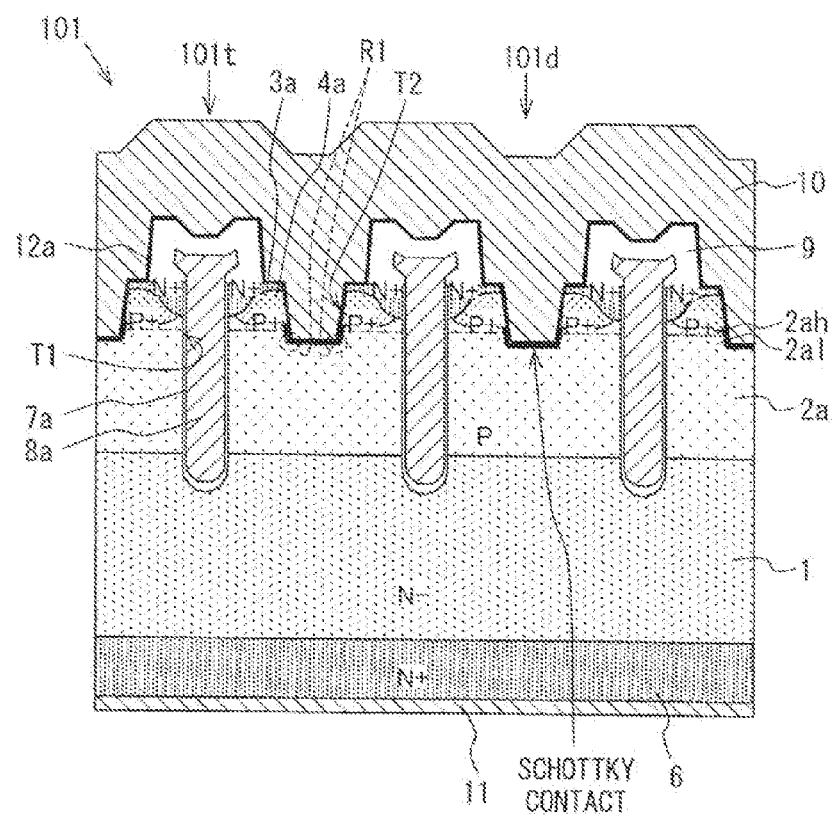
FIG. 1 shows a cross sectional side view of a semiconductor device according to a first embodiment.
Figure 15:
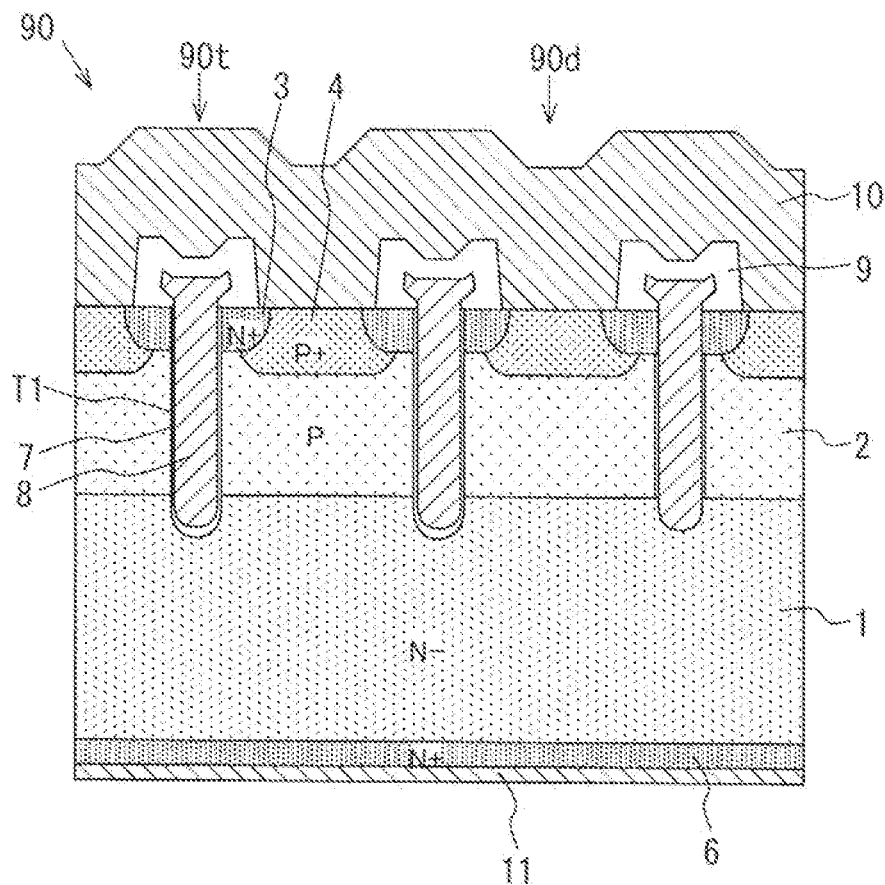
FIG. 15 shows a cross sectional side view of a semiconductor device according to a comparative example.
Figure 16:
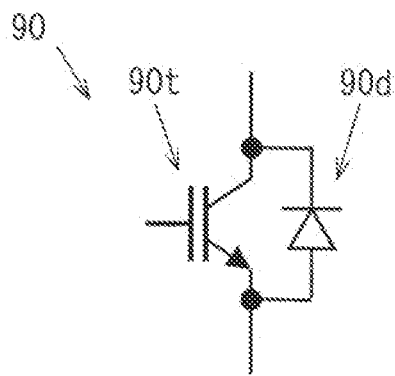
FIG. 16 shows an equivalent circuit diagram of the semiconductor device shown in FIG. 15.
Figure 17:
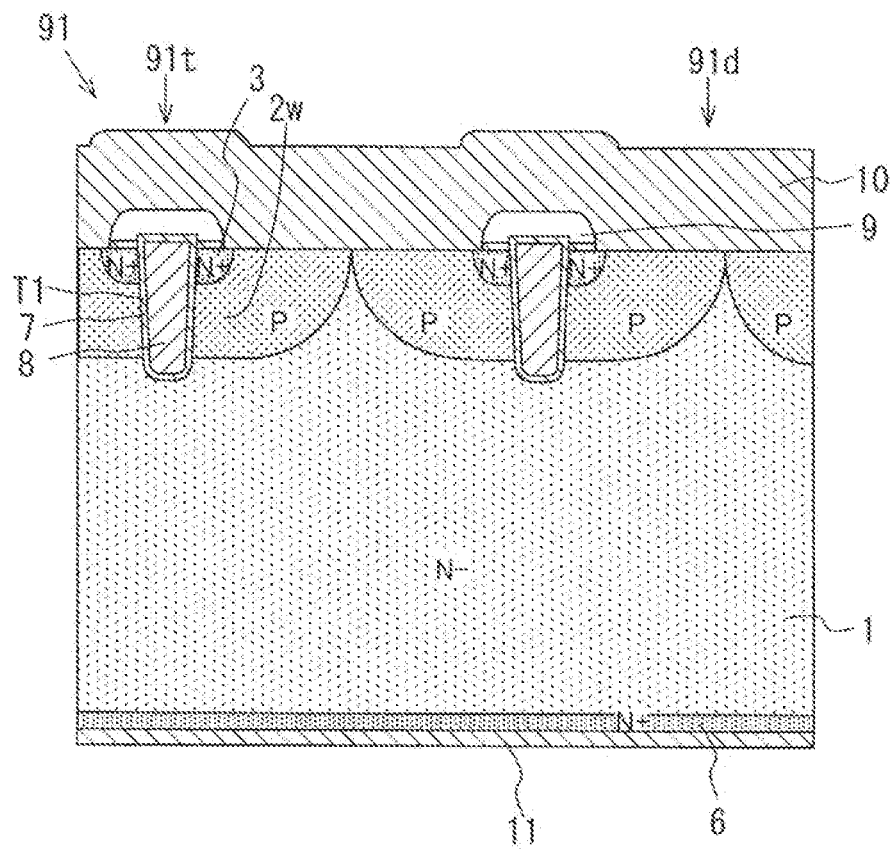
FIG. 17 shows a cross sectional side view of a conventional semiconductor device.

Hereinafter, a first embodiment of a semiconductor device will be described with reference to FIG. 1. FIG. 1 is a cross sectional side view (a view of a cross sectional structure seen from a side surface) of a semiconductor device 101 according to the first embodiment. As shown in FIG. 1, the semiconductor device 101 of the present embodiment has a structure based on the semiconductor device 90 shown in FIG. 15, and with respect to the same component with one included in the semiconductor device 90, the same reference numerals are applied.

As shown in FIG. 1, the semiconductor device 101 includes a semiconductor substrate 1 including both a trench type MOS transistor cell (hereinafter also referred to as "MOS transistor cell") 101t and a diode cell 101d. In other words, a plurality of trench type MOS transistor cells 101t, each of which includes a parasitic diode cell 101d, are formed in the semiconductor substrate 1.

Specifically, in the semiconductor device 101, a p-conductive type (P) layer 2a, in which an impurity concentration is decreased toward an inside thereof from a surface thereof, is formed over a main side surface portion of an n-conductive type (N−) semiconductor substrate 1, and a main side n-conductive type (N+) region 3a and a main side p-conductive type (P+) region 4a, each having an impurity at high concentration, are formed in a surface portion of the p-conductive type layer 2a. The main side p-conductive type region 4a is formed by diffusing the impurity so as not to reach an after-mentioned first electrode layer 8a providing a gate electrode of the MOS transistor cell 101t. A rear side n-conductive type (N+) region 6 having an impurity at high concentration is formed over a rear side surface portion of the n-conductive type semiconductor substrate 1. As the semiconductor device 101 shown in FIG. 1, it is preferable to arrange the main side p-conductive type region 4a adjacent to the main side n-conductive type region 3a. Hereby, compared with the case that the main side p-conductive type region 4a and the main side n-conductive type region 3a are arranged distantly, it becomes possible to arrange the MOS transistor cell 101t and the diode cell 101d closely and the dimensions of the semiconductor device can be minimized.

In the semiconductor device 101, a first trench T1, which reaches the n-conductive type semiconductor substrate 1, is formed to penetrate the main side n-conductive type region 3a and the p-conductive type layer 2a. Moreover, the semiconductor device 101 differs from the semiconductor device 90 of the comparative example (Please refer to FIG. 15.) in that a second trench T2, which reaches an inside of the p-conductive type layer 2a, is formed to penetrate the main side p-conductive type region 4a. In the semiconductor device 101, the second trench T2 is formed to penetrate the main side n-conductive type region 3a. Hereby, compared with the case that the second trench T2 is provided at another position without penetrating the main side n-conductive type region 3a, it becomes possible to arrange the MOS transistor cell 101t and the diode cell 101d closely and the dimensions of the semiconductor device can be minimized.

In the semiconductor device 101, the first electrode layer 8a, which is made of such as polysilicon or the like, and embedded in the first trench T1 through an insulating film 7a formed on a sidewall of the first trench T1, is used as a gate electrode of the MOS transistor cell 101t. Moreover, in the semiconductor device 101, a second electrode layer 10, which is made of such as aluminum or the like, is formed over the main side surface of the n-conductive type semiconductor substrate 1 through an interlayer insulating film 9. The second electrode layer 10 is embedded also in the second trench T2. The second electrode layer 10 is electrically coupled with the p-conductive type layer 2a by penetrating the main side n-conductive type region 3a and the main side p-conductive type region 4a, and is used as a source electrode of the MOS transistor cell 101t and an anode electrode of the diode cell 101d. In addition, the second electrode layer 10 is also coupled with the main side n-conductive type region 3a and the main side p-conductive type region 4a, and short-circuits these regions 3a and 4a. Thus, an electrical short-circuiting between a source of the MOS transistor cell 101t and a channel fixes an electrical potential of the channel so that an operation of the MOS transistor cell 101t becomes stable.

Moreover, as shown in FIG. 1, a barrier metal (a barrier film) 12a made of such as titanium (Ti) and tungsten (W) is formed at a surface of the interlayer insulating film 9 and an inner surface of the second trench T2. That is, the second electrode layer 10 contacts the p-conductive type layer 2a, the main side n-conductive type region 3a and the main side p-conductive type region 4a, that are formed in the surface portion of the p-conductive type layer 2a, through the barrier metal 12a. Hereby, alloy reaction at a contact portion of the second electrode layer 10 with the p-conductive type layer 2a can be suppressed. Further, diffusion of such as a silicon atom into the second electrode layer 10 can be suppressed, and the silicon atom is a material of the p-conductive type layer 2a.

As shown by a broken line in FIG. 1, a portion reaching the inside of the p-conductive type layer 2a, that is, a corner portion R1 at an end portion of the second trench T2 is formed to be rounded off. Hereby, it becomes easy for the second electrode layer 10 (accurately, the barrier metal 12a) to be embedded in the corners of the second trench T2. As a result, since the sharp corner at the end portion of the second electrode layer 10 embedded in the second trench T2 is removed, it becomes possible to suppress an electric field concentration and a stress concentration or the like that are always generated at the end portion. Although the corner portion R1 at the end portion of the second trench T2 is formed to be rounded off, it is not limited to this shape. Alternatively, the end portion of the second trench T2 may be formed to be rounded off entirely as the end portion of the first trench T1. Hereby, the same effect with the case that the corner portion R1 at the end portion is rounded off can be obtained.

The second trench T2 is formed by appropriate trench etching. At that time, a damage layer may be generated near the second trench T2 of the p-conductive type layer 2a. In case the damage layer is generated, since an attachment property of metal to the damage layer decreases, the second electrode layer 10 may not be embedded in the second trench T2 uniformly. On the other hand, the damage layer generated when the second trench T2 is formed in the p-conductive type layer 2a is removed in advance by, for example, chemical dry etching (CDE) or the like, and a property at an interface between the p-conductive type layer 2a and the second trench T2 becomes stable. In addition to the removal of the damage layer, the corner portion R1 at the end portion of the second trench T2 may be formed to be rounded off and the end portion of the second trench T2 may be formed to be rounded off entirely.

As shown in FIG. 1, in the semiconductor device 101, a third electrode layer 11, which is formed over the rear side surface of the n-conductive type semiconductor substrate 1 and electrically coupled with the rear side n-conductive type region 6, is used as a drain electrode of the MOS transistor cell 101t and a cathode electrode of the diode cell 101d.

In the semiconductor device 101, the p-conductive type layer 2a, in which the impurity concentration is decreased toward the inside thereof from the surface thereof, in the main side surface portion of the n-conductive type semiconductor substrate 1 is used as a channel forming layer of the MOS transistor cell 101t and provides a part of the diode cell 101d. The structure of the MOS transistor cell 101t of the semiconductor device 101 is same as that of a conventional common MOS transistor. Therefore, the MOS transistor cell 101t of the semiconductor device 101 can be obtained the same property as the conventional common MOS transistor.

Moreover, in the semiconductor device 101 including the MOS transistor cell 101t and the diode cell 101d, the main side n-conductive type region 3a, the p-conductive type layer 2a and the n-conductive type semiconductor substrate 1 provides a parasitic NPN transistor. The structure of the parasitic NPN transistor is also same as that of the semiconductor device 90 of the comparative example including the MOS transistor cell 90t and the diode cell 90d (Please refer to FIG. 15.). Therefore, a surge withstand property of the semiconductor device 101 is not inferior to that of the semiconductor device 90 of the comparative example shown in FIG. 15.

Figure 18A:
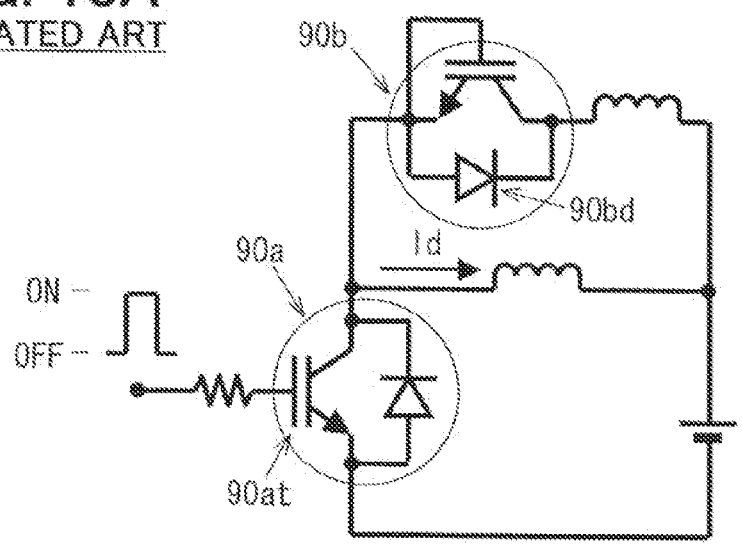
FIG. 18A shows a circuit diagram for measuring and evaluating a current waveform flowing in a diode included in the semiconductor device according to the comparative example and FIG. 18B shows an example of a measured waveform.
Figure 18B:
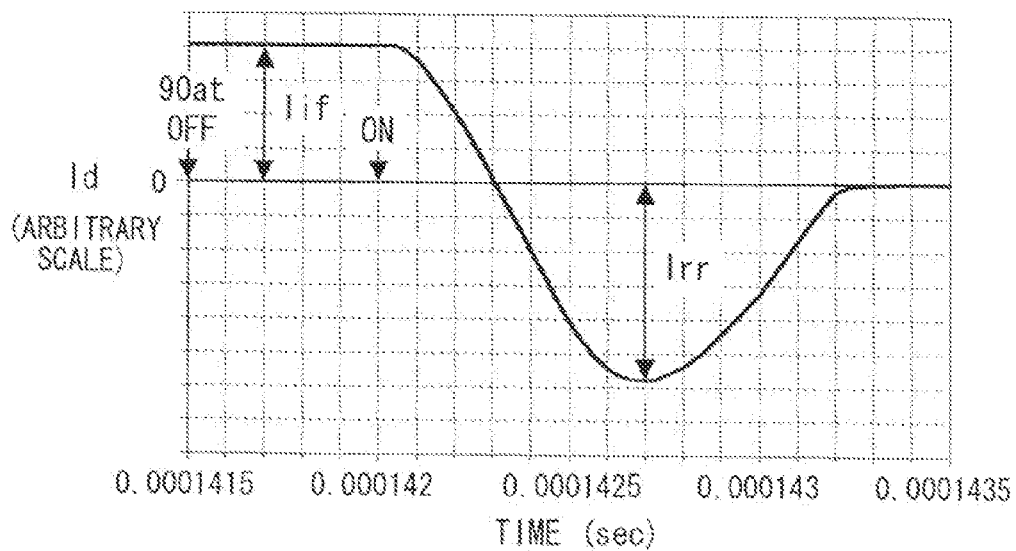

On the other hand, in the diode cell 90d of the semiconductor device 90 of the comparative example, the second electrode layer 10 as the anode electrode is electrically coupled with the p-conductive type layer 2 through the main side p-conductive type region 4 at the surface of the substrate. In the diode cell 101d of the semiconductor device 101, the second electrode layer 10, which is embedded in the second trench T2 and reaches an inside of the p-conductive type layer 2a, is electrically coupled with the p-conductive type layer 2a as the anode electrode of the diode cell 101d. The inside of the p-conductive type layer 2a, to which the anode electrode is connected, has low impurity concentration with respect to the surface thereof. Hereby, in the diode cell 101d of the semiconductor device 101, an injected hole concentration at the forward operation is decreased as compared with the diode cell 90d of the comparative example shown in FIG. 15, in which the anode electrode is connected at the surface of the substrate without the second trench T2. Therefore, in the diode cell 101d of the semiconductor device 101 in FIG. 1, the recovery current Irr at the reverse recovery step, which is described by FIG. 18B, also becomes small. Further, the recovery loss is decreased and the recovery property is improved.

As described above, the semiconductor device 101 is a semiconductor device including the MOS transistor cell 101t and the diode cell 101d, which is embedded in the MOS transistor cell 101t, over the same semiconductor substrate 1. Hereby, the recovery property of the diode cell 101d can be improved, and the deterioration of the surge withstand property can be suppressed without damaging the MOS transistor cell 101t.

In the semiconductor device 101, the main side p-conductive type region 4a is formed in the surface portion of the p-conductive type layer 2a and the second trench T2 is formed to penetrate the main side p-conductive type region 4a. Moreover, the second electrode layer 10 is connected to the main side p-conductive type region 4a at a sidewall of the second trench T2, and the connection between the second electrode layer 10 and the main side p-conductive type region 4a is ohmic contact. An impurity concentration of the main side p-conductive type region 4a is generally greater than or equal to $1 \times 10^{19}$ cm$^{-3}$, and that provides good ohmic contact with the source electrode.

The structure of the semiconductor device 101 is such that the second electrode layer 10 as the source electrode of the MOS transistor cell 101t is connected to the main side p-conductive type region 4a. Hereby, in the semiconductor device 101, the electric potential of the p-conductive type layer 2a as the channel formation layer of the MOS transistor cell 101t can be fixed completely. Specifically, since the pinch resistance of the p-conductive type layer is decreased by forming the main side p-conductive type region 4a, it becomes difficult to operate the above-mentioned parasitic NPN transistor so that the surge withstand is improved. Moreover, the structure of the semiconductor device 101 is such that the second electrode layer 10 as the anode electrode of the diode cell 101d is connected to the main side p-conductive type region 4a at the sidewall of the second trench T2, and is connected to the inside of the p-conductive type layer 2a at the end portion of the second trench T2. Hereby, as described below, the recovery property of the diode cell 101d is not deteriorated by forming the main side p-conductive type region 4a.

Moreover, in the semiconductor device 101, the p-conductive type layer 2a, in which an impurity concentration is decreased toward the inside thereof from the surface thereof, may be one layer structure formed by a single diffusion. However, it is preferable that the p-conductive type layer 2a may be two layers, which are a high concentration layer (i.e., a shallow diffusion layer) 2ah and a low concentration layer (i.e., a deep diffusion layer) 2al stacked from the main surface and formed by a double diffusion method or the like. In FIG. 1, the low concentration layer 2al and the high concentration layer 2ah are shown to be separated by the fine broken line. As shown in FIG. 1, in case that the p-conductive type layer 2a is two layers, that is, the low concentration layer 2al and the high concentration layer 2ah, the second trench T2 is formed to be reached the low concentration layer 2al, and the second electrode layer 10 is made to be electrically coupled with the low concentration layer 2al.

Moreover, in the semiconductor device 101, by providing the p-conductive type layer 2a as the two layers structure, the impurity concentrations of the low concentration layer 2al and the high concentration layer 2ah can be set separately. Hereby, the impurity concentration of the high concentration layer 2ah can be set to an impurity concentration preferable to a threshold voltage of the channel of the MOS transistor cell 101t, and the impurity concentration of the low concentration layer 2al can be set to an impurity concentration preferable to reduction of the recovery current of the diode cell 101d. Therefore, by providing the p-conductive type layer 2a as the two layers structure, each other's interference in property control of the MOS transistor cell 101t and the diode cell 101d of the semiconductor device 101 can be reduced and the property control of the MOS transistor cell 101t and the diode cell 101d becomes easy.

Moreover, it is preferable that the electrical connection between the second electrode layer 10 and the p-conductive type layer 2a at the end portion of the second trench T2 is schottky contact. Since schottky contact has rectifying action, only an electronic current flows at the diode forward operation, and hole injection from the ohmic contact portion is decreased. Hereby, schottky contact portion removes hole at the recovery step, and thereby, the recovery property is improved. In this manner, by providing the electrical connection of the second electrode layer 10 and the p-conductive type layer 2a at the end portion of the second trench T2 with schottky contact having rectifying action, the recovery current at the reverse recovery step becomes small, the recovery loss is decreased, and the recovery property can be improved compared with the case that all electrical connections are ohmic contact. Here, the second trench T2 is a main portion of the anode electrode of the diode cell.

Second Embodiment

Figure 2:
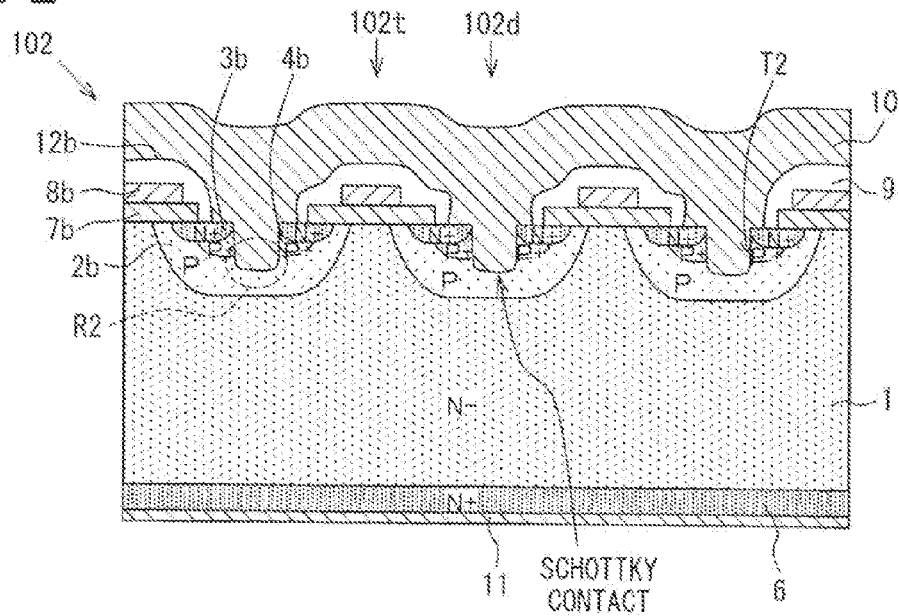
FIG. 2 shows a cross sectional side view of a semiconductor device according to a second embodiment.

Hereinafter, a second embodiment of a semiconductor device will be described with reference to FIG. 2. FIG. 2 is a cross sectional side view of a semiconductor device according to the present embodiment.

As shown in FIG. 2, a semiconductor device 102 of the second embodiment has a structure based on the semiconductor device 101 shown in FIG. 1. That is, in the semiconductor device 102, a plurality of MOS transistor cells 102t and diode cells 102d, which are similar to the structures of the MOS transistor cell 101t and the diode cell 101d in the semiconductor device 101, are formed over the n-conductive type semiconductor substrate 1. However, the MOS transistor cell 102t is not a trench type MOS transistor in the semiconductor device 102 and a plurality of planar type MOS transistors are formed in the semiconductor substrate 1.

In other words, in the semiconductor device 102 as well as the semiconductor device 101, a p-conductive type (P) region 2b, in which an impurity concentration is decreased toward an inside thereof from a surface thereof, is formed over a main side surface portion of an n-conductive type (N−) semiconductor substrate 1, and a main side n-conductive type (N+) region 3b having an impurity at high concentration is formed in a surface portion of the p-conductive type region 2b to reach the main side of the semiconductor substrate 1. Moreover, a main side p-conductive type (P+) region 4b having an impurity at high concentration is formed just below the main side n-conductive type (N+) region 3b in the p-conductive type (P) region 2b. The main side p-conductive type (P+) region 4b is not formed to cover vicinity of the main side n-conductive type region 3b, and formed by diffusing the impurity to obtain a PN junction between the p-conductive type region 2b and the main side n-conductive type region 3b, as shown in FIG. 2. Moreover, as shown in FIG. 2, a rear side n-conductive type (N+) region 6 having an impurity at high concentration is formed over a rear side surface portion of the n-conductive type semiconductor substrate 1.

However, unlike the semiconductor device 101, a first trench T1 is not formed and a second trench T2 is formed to reach a deep layer portion of the p-conductive type region 2b by penetrating the main side n-conductive type region 3b and the main side p-conductive type region 4b in the semiconductor device 102. Hereby, compared with the case that the second trench T2 is provided at another portion without penetrating the main side n-conductive type region 3b, it becomes possible to arrange the MOS transistor cell 102t and the diode cell 102d closely, and the dimensions of the semiconductor device can be minimized.

Moreover, in the semiconductor device 102, an insulating film 7b made of such as silicon dioxide (SiO$_2$) film is formed over the main side surface of the semiconductor substrate 1 so as to contact the p-conductive type region 2b, the main side n-conductive type region 3b and a portion in which the p-conductive type region 2b is not formed. A first electrode layer 8b is formed over a surface of the insulating film 7b, and used as a gate electrode of the MOS transistor cell 102t.

Moreover, in the semiconductor device 102, a second electrode layer 10 made of such as aluminum or the like is formed over the main side surface of the semiconductor substrate 1 through an interlayer insulating film 9. The second electrode layer 10 is also embedded in the second trench T2. The second electrode layer 10 is electrically coupled with the p-conductive type region 2b by penetrating the main side n-conductive type region 3b and the main side p-conductive type region 4b, and used as a source electrode of the MOS transistor cell 102t and an anode electrode of the diode cell 102d. The second electrode layer 10 is also connected to the main side n-conductive type region 3b and the main side p-conductive type region 4b so that the second electrode layer 10 short-circuits the regions 3b and 4b. Thus, an electrical short-circuiting between a source of the MOS transistor cell 102t and a channel fixes an electrical potential of the channel, and an operation of the MOS transistor cell 102t becomes stable.

Moreover, as shown by a broken line in FIG. 2, a portion reaching the inside of the p-conductive type layer 2b, that is, an end portion R2 of the second trench T2 is provided to be rounded off entirely. Hereby, it becomes easy for the second electrode layer 10 (accurately, a barrier metal 12b) to be embedded in the corners of the second trench T2. Moreover, as a result, since the sharp corner at the end portion of the second electrode layer 10 embedded in the second trench T2 is removed, it becomes possible to suppress an electric field concentration and a stress concentration or the like that are always generated at the end portion having a rectangular cross section of a side of the end portion (i.e., ordinary trench shape).

Third Embodiment

Figure 3:
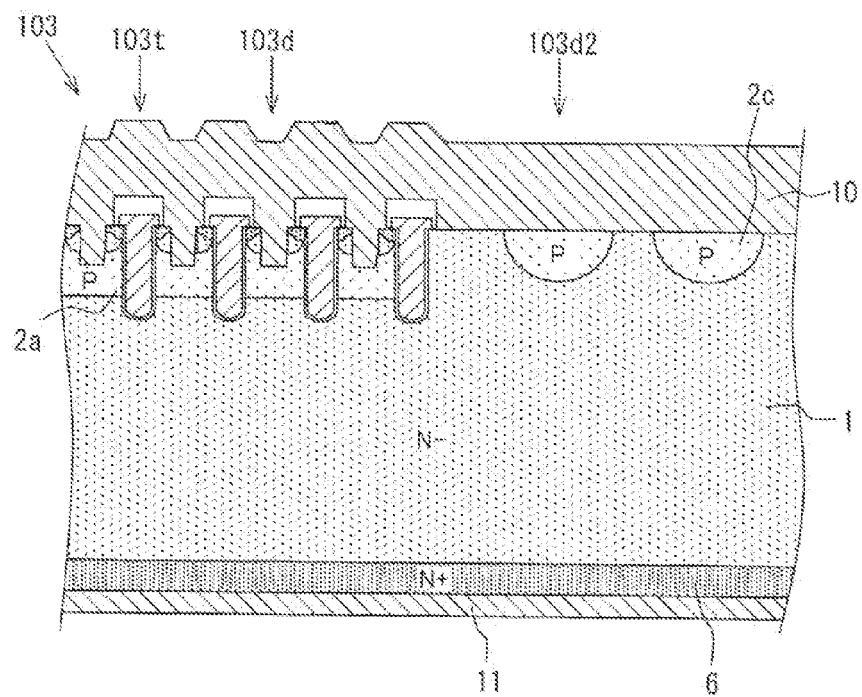
FIG. 3 shows a cross sectional side view of a semiconductor device according to a third embodiment.

Hereinafter, a third embodiment of a semiconductor device will be described with reference to FIG. 3. FIG. 3 is a cross sectional side view of a semiconductor device according to the embodiment.

As shown in FIG. 3, a semiconductor device 103 of the present embodiment has a structure based on the semiconductor device 101 shown in FIG. 1. That is, in the semiconductor device 103, a plurality of MOS transistor cells 103t and diode cells 103d, which are similar to the structures of the MOS transistor cell 101t and the diode cell 101d in the semiconductor device 101, are formed over the n-conductive type semiconductor substrate 1.

However, as shown in FIG. 3, in the semiconductor device 103 of the present embodiment, a main side second p-conductive type (P) region 2c is arranged in the main side surface portion of the n-conductive type semiconductor substrate 1 of a region, which is a different position from the diode cell 103d, and at which the p-conductive type layer 2a is not formed. Moreover, the second electrode layer 10 is electrically coupled with not only the p-conductive type layer 2a but also the main side second p-conductive type region 2c. Therefore, the semiconductor device 103 has a structure such that the second diode cell 103d2 including the main side second p-conductive type region 2c, the n-conductive type semiconductor substrate 1 and the rear side n-conductive type region 6 is provided in the diode cell 103d, and the second electrode layer 10 is used as an anode electrode and the third electrode layer 11 is used as a cathode electrode.

For details, the diode cell (so-called a body diode cell) 101d including the p-conductive type layer 2a, the n-conductive type semiconductor substrate 1 and the rear side n-conductive type region 6 of the semiconductor device 101 can improve the recovery property as described above. However, the current capacity of the diode cell 101d becomes small compared with the body diode cell 90d of the comparative example in which the second electrode layer (the anode electrode) 10 is connected at the substrate surface without the second trench T2. Thus, as the semiconductor device 103 shown in FIG. 3, a requisite current capacity can be obtained by providing the second diode cell 103d2 at a different position from the (body) diode cell 103d.

In the second diode cell 103d2, the second electrode layer (the anode electrode) 10 is connected to the main side second p-conductive type region 2c at the substrate surface as a conventional way. However, the main side second p-conductive type region 2c can be provided far from the MOS transistor cell 103t and the impurity concentration can be set suitably so that deterioration of the recovery property can be suppressed.

Each of the semiconductor devices 101 to 103 shown in each of FIGS. 1 to 3 is a semiconductor device in which the p-conductive type layer 2a is formed over the main side surface portion of the n-conductive type semiconductor substrate 1, and the n-channel MOS transistor cell and the diode cell having the main side p-conductive type layer 2a as the anode are formed. On the other hand, it is obvious that the description of the effect with respect to the semiconductor devices 101 to 103 is applicable to a semiconductor device, in which conductive types of regions included in each of the semiconductor devices 101 to 103 are all reversed, an n-conductive type layer is formed at a main side surface portion of a p-conductive type semiconductor substrate, and a p-channel MOS transistor cell and a diode cell having the main side n-conductive type layer as a cathode are formed. Therefore, in the semiconductor device, in which conductive types of regions included in each of the semiconductor devices 101 to 103 are all reversed, the recovery property can be improved without impairing the characteristic of the transistor cell, and the surge withstand property does not deteriorate.

Each of the above-mentioned semiconductor devices is a semiconductor device in which the MOS transistor cell and the diode cell embedded in the MOS transistor cell are provided over the same semiconductor substrate. In the semiconductor device, the recovery property can be improved without impairing the characteristic of the diode cell and the surge withstand property does not deteriorate. Therefore, it is preferable that the above-mentioned semiconductor device is used in an inverter circuit, and the diode or the second diode provided with the MOS transistor in the semiconductor device is used as a free wheel diode.

In the first to third embodiments, although the semiconductor devices 101 and 103 in which the trench type MOS transistor cell and the diode cell are provided in the same semiconductor substrate, or the semiconductor device 102 in which the planar type MOS transistor cell and the diode cell are provided in the same semiconductor substrate, are described, the semiconductor devices 101 to 103 may have a different structure. As another example, the MOS transistor cell may be replaced by an IGBT cell.

Fourth Embodiment

Figure 4:
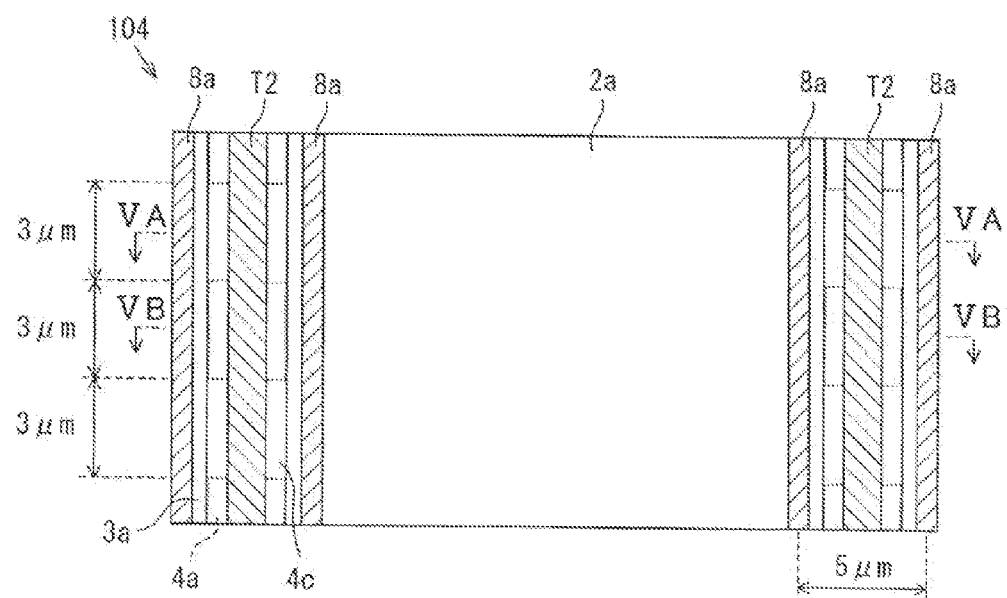
FIG. 4 shows a plan view showing a planar structure of a semiconductor device according to a fourth embodiment.
Figure 5A:
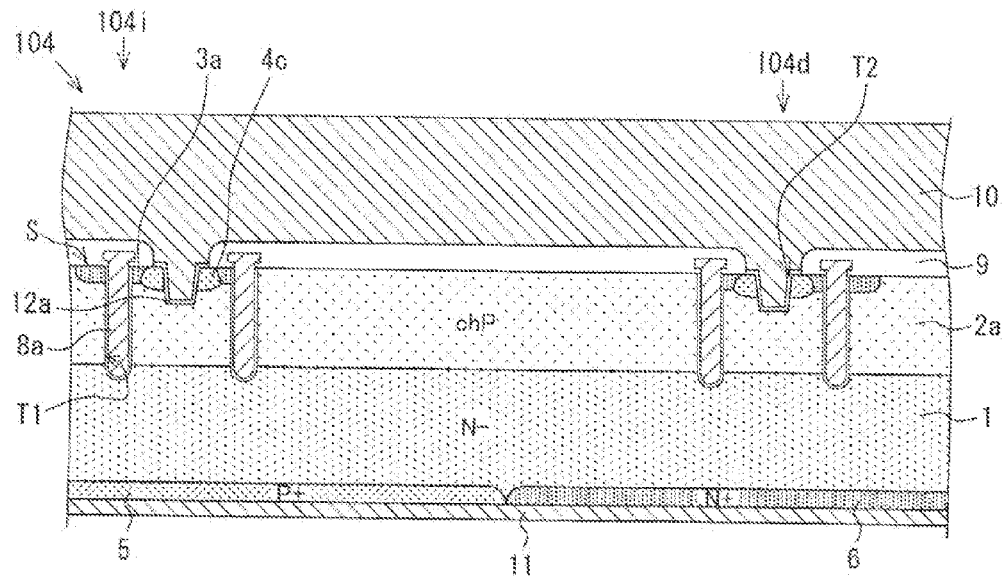
FIG. 5A shows a cross sectional side view taken along a line VA-VA in FIG. 4
Figure 5B:
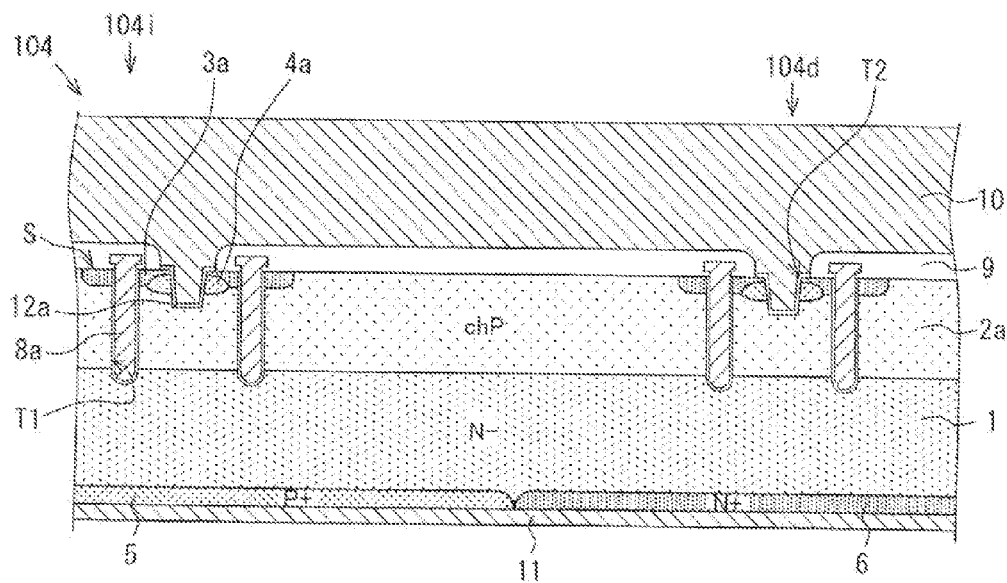
FIG. 5B shows a cross sectional side view taken along a line VB-VB in FIG. 4.

Hereinafter, a fourth embodiment of a semiconductor device will be described with reference to FIGS. 4, 5A and 5B. FIG. 4 is a plan view showing a planar structure (a structure seen from a planar side) of a semiconductor device 104 according to the fourth embodiment, FIG. 5A is a cross sectional side view taken along a line VA-VA in FIG. 4 and FIG. 5B is a cross sectional side view taken along a line VB-VB in FIG. 4. As shown in FIGS. 4, 5A and 5B, a semiconductor device 104 of the present embodiment has a structure based on the semiconductor device 101 shown in FIG. 1. Thus, the same element with one included in the semiconductor device 101 is shown by the same reference numeral and a redundant description is omitted.

In the semiconductor device 104 of the present embodiment, the MOS transistor cell 101t of the semiconductor transistor 101 is replaced by an IGBT cell 104i. That is, a plurality of IGBT cells 104i and diode cells 104d are provided in the n-conductive type semiconductor substrate 1.

For details, as shown in FIGS. 5A and 5B, a rear side p-conductive type (P+) region 5 and a rear side n-conductive type (N+) region 6, each having an impurity at high concentration, are arranged over a rear side surface portion of the n-conductive type semiconductor substrate 1, and a third electrode layer 11, which short-circuits the regions 5 and 6 by the electrically common connection, is formed over the rear side surface of the n-conductive type semiconductor substrate 1. The third electrode layer 11 provides a collector electrode of the IGBT cell 104i and a cathode electrode of the diode cell 104d. Moreover, a second electrode layer 10 made of such as aluminum (Al) is formed over a main side S surface of the n-conductive type semiconductor substrate 1 through an interlayer insulating film 9, and the second electrode layer 10 is also embedded in a second trench T2. The second electrode layer 10 is electrically coupled with the p-conductive type layer 2a by penetrating the main side n-conductive type region 3a and an after-mentioned main side p-conductive type region 4a or penetrating the main side n-conductive type region 3a and an after-mentioned main side p-conductive type region 4c, provides an emitter electrode of the IGBT cell 104i and an anode electrode of the diode cell 104d. Moreover, a first electrode layer 8a made of such as polysilicon is embedded in the first trench T1, and the first electrode layer 8a provides a gate electrode of the IGBT cell 104i.

Moreover, in the present embodiment, as the above-mentioned main side p-conductive type region, the semiconductor device 104 includes a main side p-conductive type region 4c having both an exposed surface which is exposed at the main side S of the n-conductive type semiconductor substrate 1 and an unexposed surface which is not exposed at the main side S of the n-conductive type semiconductor substrate 1, and a main side p-conductive type region 4a having only an unexposed surface which is not exposed at the main side S of the n-conductive type semiconductor substrate 1. As shown in FIG. 5A, the second electrode layer 10 is electrically coupled with the unexposed surface of the main side p-conductive type region 4c at a sidewall of the second trench T2 and the exposed surface of the main side p-conductive type region 4c at the main side S of the n-conductive type semiconductor substrate 1. On the other hand, as shown in FIG. 5B, the second electrode layer 10 is electrically coupled with the unexposed surface of the main side p-conductive type region 4a at a sidewall of the second trench T2.

Moreover, in the present embodiment, as shown in FIG. 4, the main side p-conductive type region 4a and the main side p-conductive type region 4c, planar views of which are rectangular shapes, are formed alternately at intervals of 3 μm, for example, over the main side S of the n-conductive type semiconductor substrate 1 (so-called a stripe ladder pattern). Moreover, the first electrode layers 8a are formed at intervals of 5 μm, for example, with the second trench T2 sandwiched therebetween.

For example, in case that the semiconductor device has only the cross sectional side structure shown in FIG. 5B, the second electrode layer 10 is electrically coupled with the unexposed surface of the main side p-conductive type region 4a only at the sidewall of the second trench T2. Therefore, the recovery current flows through a current pathway through the n-conductive type semiconductor substrate 1, the p-conductive type layer 2a, the main side p-conductive type region 4a (the unexposed surface) and the second electrode layer 10 (the sidewall of the second trench T2) at the diode recovery operation. When the recovery current flows through the above-mentioned current pathway, the resistance at the sidewall of the second trench T2 is large and it becomes easy for the parasitic NPN transistor to operate. In the result, the semiconductor device 104 may be broken.

In the semiconductor device 104, the cross sectional side structure shown in FIG. 5A and the cross sectional side structure shown in FIG. 5B are formed alternately. In the cross sectional structure shown in FIG. 5A, the second electrode layer 10 is electrically coupled with the unexposed surface of the main side p-conductive type region 4c at the sidewall of the second trench T2 and the exposed surface of the main side p-conductive type region 4c at the main side S of the n-conductive type semiconductor substrate 1. Since impurity concentrations of the p-conductive type regions 4a and 4c are decreased toward the inside thereof from the main side S, the resistance between the second electrode layer 10 and the exposed surface of the main side p-conductive type region 4c at the main side S of the n-conductive type semiconductor substrate 1 is smaller than the resistance between the second electrode layer 10 and the unexposed surface of the main side p-conductive type region 4c at the sidewall of the second trench T2. Therefore, the recovery current flows through a current pathway through the n-conductive type semiconductor substrate 1, the p-conductive type layer 2a, the main side p-conductive type region 4a (the exposed surface) and the second electrode layer 10 (the main side of the n-conductive type semiconductor substrate 1) at the diode recovery operation. Since the resistance at the main side of the n-conductive type semiconductor substrate 1 is small, even when the high-density current flows, it becomes difficult for the parasitic NPN transistor to operate, and thereby, the recovery current is withdrawn. Thus, the semiconductor device 104 provides a high breakdown voltage element.

FIG. 6 shows a diagram of comparative results based on experiments between the cross sectional side structure in FIG. 5A and the cross sectional side structure in FIG. 5B. As shown in FIG. 6, in case of the cross sectional side structure shown in FIG. 5B, the resistance between the second electrode layer 10 and the unexposed surface of the main side p-conductive type region 4a at the sidewall of the second trench T2 is approximately 20000 $\Omega \cdot \mu m^2$. On the other hand, in case of the cross sectional side structure shown in FIG. 5A, the resistance between the second electrode layer 10 and the exposed surface of the main side p-conductive type region 4c at the main side S of the n-conductive type semiconductor substrate 1 is approximately 70 $\Omega \cdot \mu m^2$. In this manner, since these resistances vary widely, in case that the breaking energy, which is needed to break the semiconductor device having the cross sectional side structure shown in FIG. 5B, is presumed to be "1", the breaking energy, which is needed to break the semiconductor device having the cross sectional side structure shown in FIG. 5A becomes "greater than or equal to 3". The semiconductor device 104 of the present embodiment is confirmed to be a high breakdown voltage element.

Figure 7A:
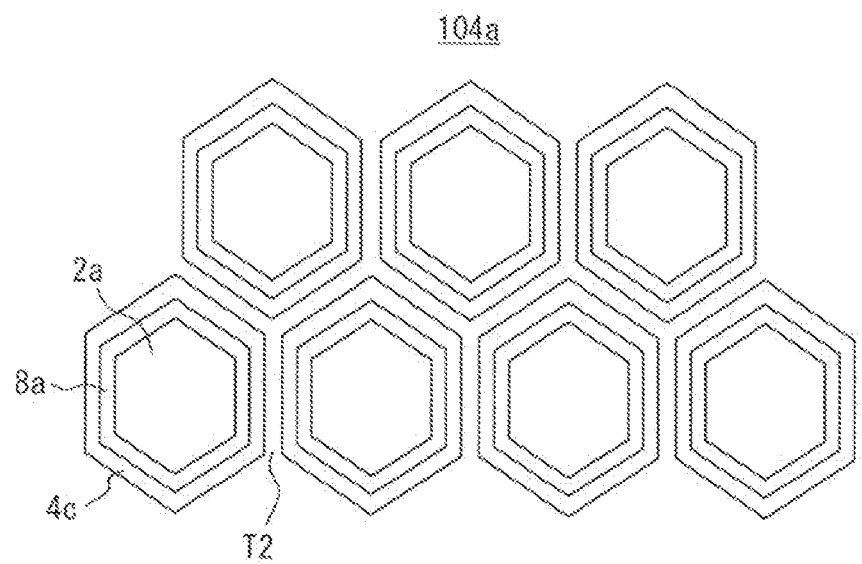
FIGS. 7A and 7B shows plan views showing planar structures according to modifications of the fourth embodiment.
Figure 7B:
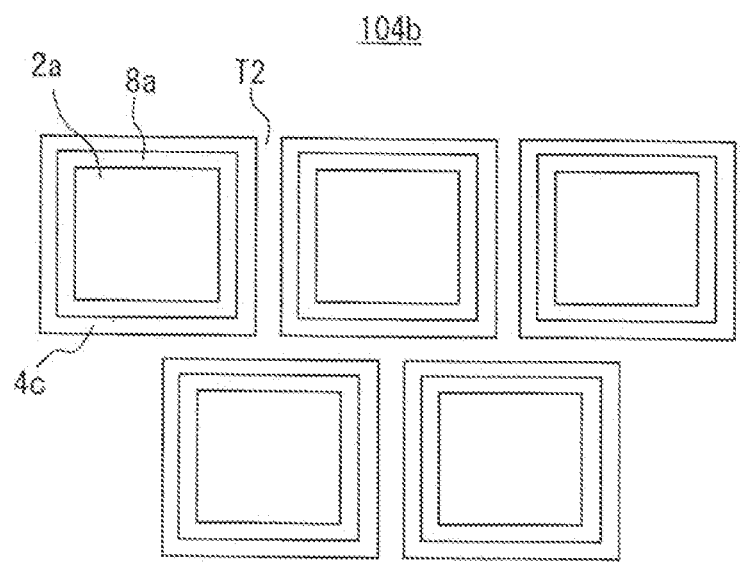

In the present embodiment, the shape of the planar view of the exposed surface and the unexposed surface of the main side p-conductive type region 4c over the main side S of the n-conductive type semiconductor substrate 1 may be arbitrarily-structured other than the rectangular planar shape. For example, as shown in FIG. 7A, the semiconductor device 104a having the hexagonal planar shape may be used. Moreover, as shown in FIG. 7B, the semiconductor device 104b having the lattice planar shape may be used. In FIGS. 7A and 7B, a part of the main side p-conductive type region 4c is the exposed surface and the main side p-conductive type region 4c does not have only the unexposed surface.

Fifth Embodiment

Figure 8A:
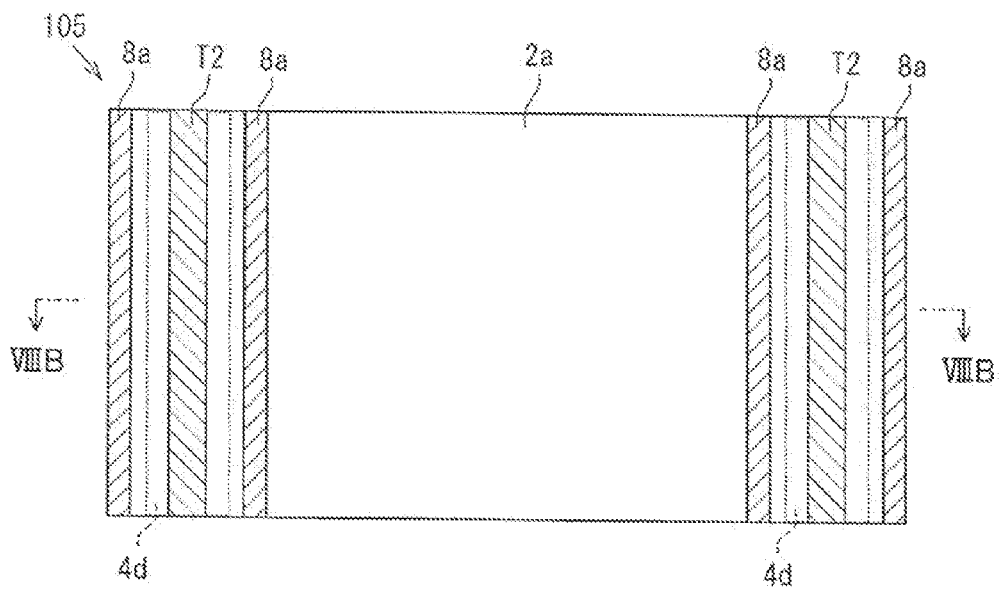
FIG. 8A shows a plan view showing a planar structure of a semiconductor device according to a fifth embodiment and FIG. 8B shows a cross sectional side view taken along a line VIII-VIII in FIG. 8A.

Hereinafter, a fifth embodiment of a semiconductor device and a manufacturing method thereof will be described with reference to FIGS. 8A, 8B and 9. FIG. 8A is a plan view showing a planar structure of the semiconductor device 105 according to the fifth embodiment, FIG. 8B shows a cross sectional side view taken along a line VIII-VIII in FIG. 8A and FIG. 9 is a view showing the manufacturing method of the semiconductor device having the structure shown in FIGS. 8A and 8B.

Figure 8B:
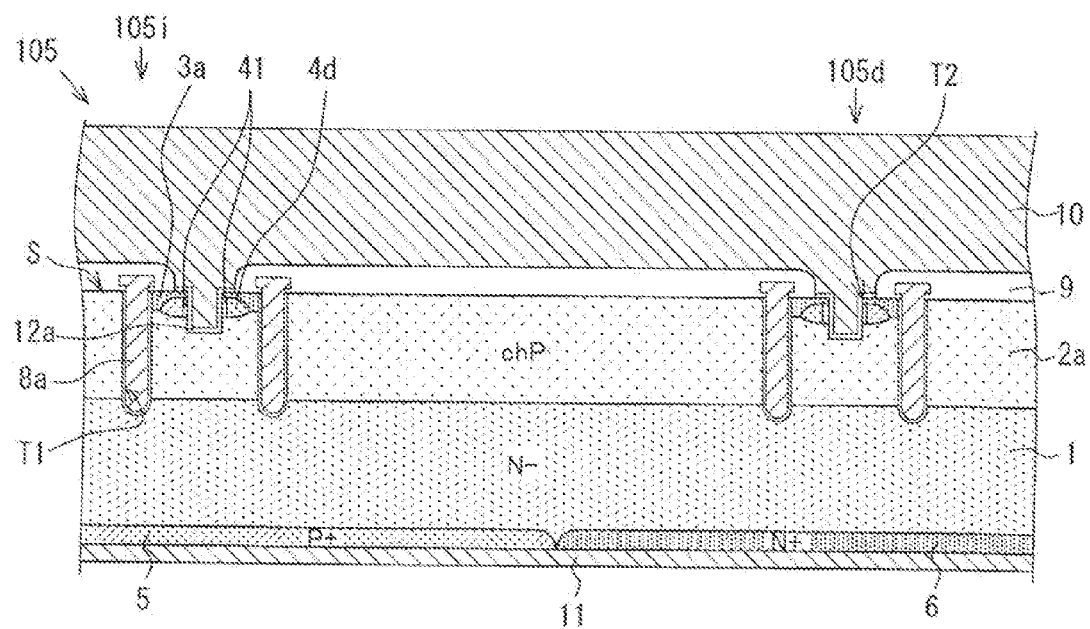
Figure 9:
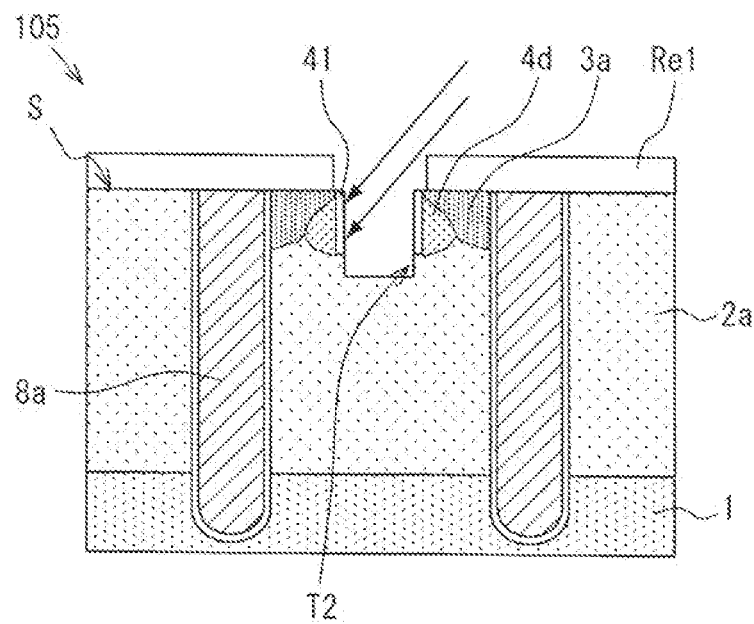
FIG. 9 shows a view showing a manufacturing method of a semiconductor device according to the fifth embodiment.

As shown in FIGS. 8A and 8B, the semiconductor device 105 of the present embodiment has a structure based on the semiconductor device 104 shown in FIGS. 4, 5A and 5B, that is, a plurality of IGBT cells 105i and diode cells 105d are provided in the n-conductive type semiconductor substrate 1. Thus, the same element with one included in the semiconductor device 101 is shown by the same reference numeral and a redundant description is omitted.

However, in the present embodiment, the semiconductor device 105 includes a main side p-conductive type region 4d, in which a contact portion 41 of the main side p-conductive type region which contacts the second electrode layer 10 has a p-conductive type impurity concentration higher than the other portion of the main side p-conductive type region, without including the main side p-conductive type region 4c.

In the structure of the semiconductor device 105, the resistance of the contact portion 41 of the main side p-conductive type region 4d which contacts the second electrode layer 10 can be decreased and the contact portion 41 can be ohmic contact. Thus, the base pinch resistance of the parasitic NPN transistor can be decreased and it becomes difficult for the parasitic NPN transistor to operate. Therefore, high breakdown voltage property can be obtained.

Moreover, in the semiconductor device 104 shown in FIGS. 4, 5A and 5B, the cross sectional side structures shown in FIGS. 5A and 5B are obtained by forming the so-called stripe ladder pattern. Hereby, the base resistance of the parasitic NPN transistor is decreased. However, in the semiconductor device 105 of the present embodiment, as shown in FIG. 8B, the base resistance of the parasitic NPN transistor can be decreased by only the cross sectional side structure corresponding to FIG. 5B. Therefore, the exposed surface which exposes at the main side S of the n-conductive type semiconductor substrate 1 needs not to be formed in the main side p-conductive type region and the second electrode layer 10 may only be electrically coupled with the unexposed surface of the main side p-conductive type region at the sidewall of the second trench T2. Therefore, the contact area between the second electrode layer 10 and the main side p-conductive type region can be decreased and the intervals between each of the first trenches T1, which sandwich the second trench T2, can be narrower. Hereby, the dimensions of the semiconductor device can be minimized.

Since the resistance of the contact portion 41 is decreased, the driving voltage of the IGBT cell 105i can be lowered. In addition, the cell structures are equalized and the operation thereof can be equalized. Therefore, high breakdown voltage property can be obtained.

Next, the manufacturing method of the semiconductor device 105 will be described with reference to FIG. 9. In manufacturing the semiconductor device 105, firstly, a mask, which is not shown in the drawings, is formed over the main side S of the n-conductive type semiconductor substrate 1 by a predetermined pattern. The second trench T2 is formed by etching with the mask, and then, the mask is removed and a resist Re1 is formed by photolithography. After forming the resist Re1, ion implantation of the p-conductive type impurity such as boron (B) or the like is performed with respect to the main side S of the n-conductive type semiconductor substrate 1 (accurately, the resist Re1) at an angle by which the impurity can hit the sidewall of the second trench T2 (a predetermined angle) by using a suitable ion implanter, which is not shown in the drawings (so-called inclined ion implantation). When performing the inclined ion implantation, the implantation energy of the ion implanter is set so that the impurity concentration of the sidewall of the second trench T2 (the contact portion 41) becomes highest.

After performing the inclined ion implantation, a predetermined thermal treatment is performed so that the implanted ion is diffused inside the n-conductive type semiconductor substrate 1. In this manner, the sidewall (the contact portion 41 which contacts the second electrode layer 10) of the second trench T2 of the main side p-conductive type region 4d is set to have higher concentration p-conductive type than the other portion other than the sidewall (the contact portion 41). And then, the resist Re1 which is formed over the main side S of the n-conductive type semiconductor substrate 1 is removed.

Although the mask is removed and the resist Re1 is formed after forming the second trench T2 in the present embodiment, the other methods may be used. For example, in case that the mask is formed by using a silicon oxide film, since the silicon oxide film can be used as the resist when performing the inclined ion implantation, after forming the second trench T2 with the silicon oxide film, the silicon oxide film may be used further as the resist when performing the inclined ion implantation.

Moreover, all ions which are emitted from the ion implanter are not implanted to the p-conductive type layer 2a (for details, the n-conductive type semiconductor substrate 1) at the predetermined angle when performing the inclined ion implantation. A portion of the ions are not implanted at the predetermined angle and the ions may be implanted into the bottom of the second trench T2. In this case, since the p-conductive type concentration of the p-conductive type layer 2a increases at the bottom of the second trench T2, schottky contact between the second electrode layer 10 and the p-conductive type layer 2a at the bottom of the second trench T2 is impaired and the recovery property may be affected.

Figure 10:
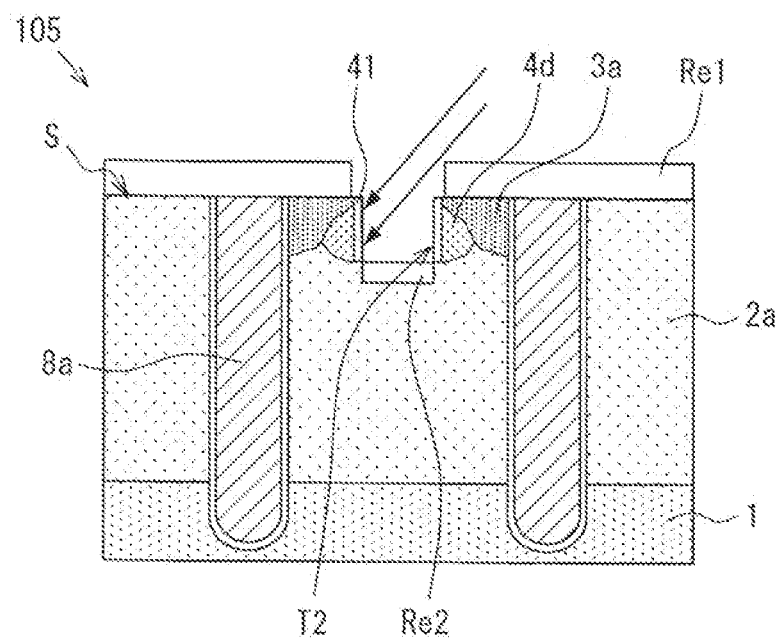
FIG. 10 shows a view showing a manufacturing method of a semiconductor device according to a modification of the fifth embodiment.

As shown in FIG. 10, in case that the resist Re1 is formed by lithography, exposure may be performed so as to remain the resist Re2 at the bottom of the trench T2. Hereby, in case that ions implanted into the bottom of the second trench T2 are included in a portion of ions emitted from the ion implanter, since the resist Re2 remains at the bottom of the second trench T2, the ions can be captured. Therefore, implantation of the p-conductive type impurity ions into the p-conductive type layer 2a included in the second electrode layer 10 at the bottom of the second trench T2 can be decreased. Hereby, schottky contact is not impaired and the recovery property is not affected. Incidentally, after performing the inclined ion implantation, the resist Re2 is removed.

Alternatively, after performing the inclined ion implantation, the n-conductive type impurity ions such as arsenic and phosphorous or the like may be implanted into only the bottom of the second trench T2. The p-conductive type impurity ions are implanted into the bottom of the second trench T2 during performing the inclined ion implantation and the p-conductive type impurity concentration is increased. However, the increased p-conductive type impurity concentration can be decreased by implanting the n-conductive type impurity ions into the bottom of the second trench T2. That is, the increased concentration by the inclined ion implantation can be neutralized. Therefore, the p-conductive type concentration of the p-conductive type layer 2a at the bottom of the second trench T2 is not increased, and the impairment of the schottky contact between the second electrode layer 10 and the p-conductive type layer 2a at the bottom of the second trench T2 and the influence to the recovery property are decreased.

Sixth Embodiment

Figure 11:
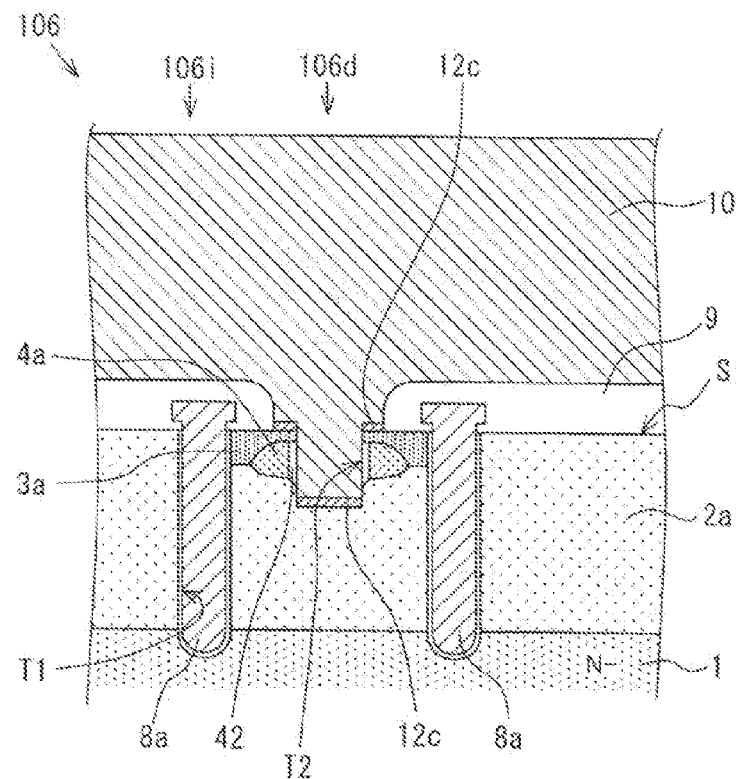
FIG. 11 shows a cross sectional side view of a semiconductor device according to a sixth embodiment.

Hereinafter, a sixth embodiment of a semiconductor device will be described with reference to FIG. 11. FIG. 11 is a cross sectional side view of a semiconductor device 106 according to the sixth embodiment. As shown in FIG. 11, the semiconductor device 106 of the present embodiment has a structure based on each of the semiconductor devices 104 and 105 shown in FIGS. 5A, 5B, 8A and 8B, that is, a plurality of IGBT cells 106i and diode cells 106d are formed in the n-conductive type semiconductor substrate 1. Thus, the same element with one included in the semiconductor devices 104 and 105 is shown by the same reference numeral and a redundant description is omitted.

However, in the present embodiment, a barrier metal 12c, the thickness of which is greater than or equal to a predetermined thickness, is formed between the second electrode layer 10 and the p-conductive type layer 2a at the bottom of the second trench T2, and a thin metal film which does not function as a barrier film (not shown in the drawings) is formed between the second electrode layer 10 and the p-conductive type layer 2a at a sidewall of the second trench T2. That is, the barrier metal 12c is not formed between the second electrode layer 10 and the p-conductive type layer 2a at the sidewall of the second trench T2. Therefore, electrically connection between the second electrode layer 10 and the p-conductive type layer 2a is schottky contact, while electrically connection between the second electrode layer 10 and the p-conductive type layer 2a at the sidewall of the second trench T2 is ohmic contact. A PN junction diode structured by the p-conductive type layer 2a and the n-conductive type semiconductor substrate 1 is a lower injection diode which suppresses the hole injection amount injected into the p-conductive type layer 2a from the second electrode layer 10.

Next, the manufacturing method of the semiconductor device 106 will be described. In manufacturing the above-mentioned semiconductor device 106, a second trench T2 is formed firstly by such as etching or the like so that the angle between the main side S of the n-conductive type semiconductor substrate 1 and the sidewall of the second trench T2 is approximately 80 to 90 degrees, for example, in a second trench forming process.

After forming the second trench T2 by the second trench forming process, in a barrier metal forming process, a barrier metal 12c is formed by sputtering method with respect to the n-conductive type semiconductor substrate 1 in an atmosphere set to be 350 degrees Celsius with use such as tungsten. In the manufacturing method, the barrier metal 12c having 1000 to 4000 Å thickness, for example, is desired to be formed. At this time, at the bottom of the second trench T2, the barrier metal having 5.5 μm thickness is formed. On the other hand, at the sidewall of the second trench T2, the barrier film 12c is hardly formed (Practically, a metal film having thickness less than or equal to 100 Å is formed, for example.)

In the barrier metal forming process, the barrier metal 12c is formed in the second trench T2, and further, the second electrode layer 10 is embedded with the use of such as aluminum, and then thermal treatment process is performed. In the thermal treatment process, the temperature in the atmosphere is set to be 450 to 550 degrees Celsius, for example.

Under the temperature, since the barrier metal 12c is hardly formed at the sidewall of the second trench T2, aluminum diffuses inside the p-conductive type layer 2a. Since aluminum is p-conductive type, a high concentration p-conductive type region 42 is formed at the sidewall of the second trench T2 and the electrically connection between the second electrode layer 10 and the p-conductive type layer 2a at the sidewall of the second trench T2 is ohmic contact. On the other hand, since the thick barrier metal 12c is formed at the bottom of the second trench T2, aluminum does not diffuse inside the p-conductive type layer 2a. Since the concentration of the p-conductive type layer 2a just below the bottom of the second trench T2 is $1 \times 10^{16}$ to $1 \times 10^{17}$ cm$^{-3}$, the electrically connection between the second electrode layer 10 and the p-conductive type layer 2a at the bottom of the second trench T2 is schottky contact. Hereby, the semiconductor device 106 can be manufactured.

Seventh Embodiment

Figure 12:
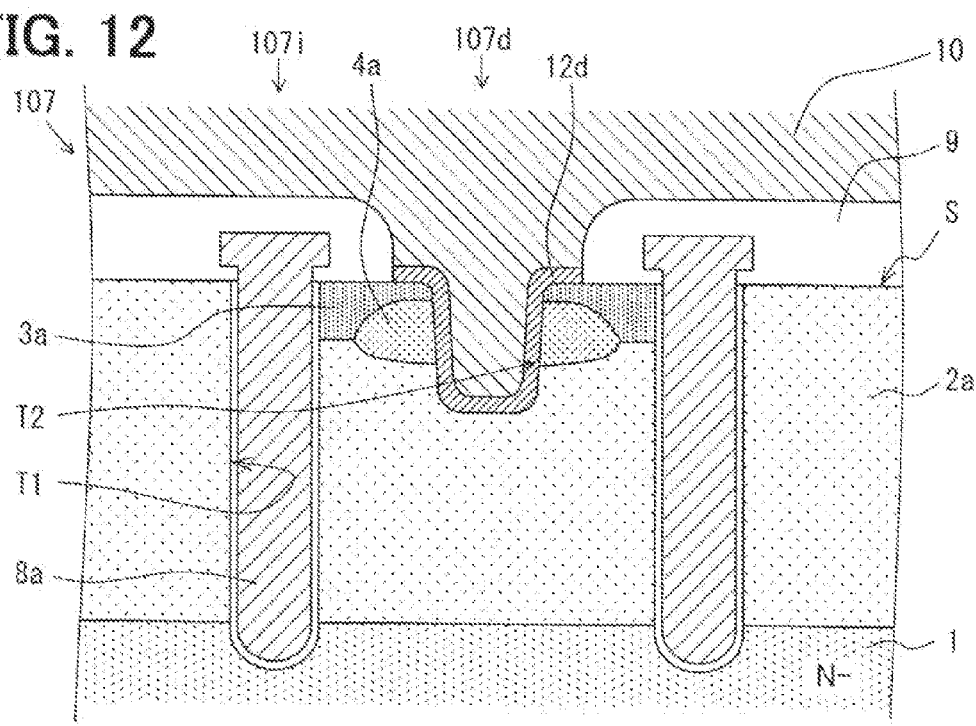
FIG. 12 shows a cross sectional side view of a semiconductor device according to a seventh embodiment.

Hereinafter, a seventh embodiment of a semiconductor device and a manufacturing method thereof will be described with reference to FIG. 12. FIG. 12 is a cross sectional side view showing a cross sectional side structure of a semiconductor device 107 according to the seventh embodiment.

As shown in FIG. 12, the semiconductor device 107 of the present embodiment has a structure based on the semiconductor devices 104, 105 and 106 shown in FIGS. 5A, 5B, 8A, 8B and 11, that is, a plurality of IGBT cells 107i and diode cells 107d are formed in the n-conductive type semiconductor substrate 1. Thus, the same element with one included in the semiconductor devices 104, 105 and 106 is shown by the same reference numeral and a redundant description is omitted.

However, in the semiconductor device 107 of the present embodiment, the damage layer, which was formed at the inner surface including the sidewall and the bottom of the second trench T2 when forming the second trench T2 in the p-conductive type layer 2a, is omitted. In particular, the damage layer, thickness of which is only 100 to 200 Å, is formed at the p-conductive type layer 2a and the damage layer is removed by such as CDE. In the state that the damage layer is removed, a barrier metal 12d is formed to have a predetermined film thickness. Hereby, because of the attachment property with the inner surface of the second trench T2, the barrier metal 12d is attached to the inner surface of the second trench T2 at uniform thickness, and the barrier function for preventing the diffusion of the second electrode layer 10 embedded in the second trench T2 into the p-conductive type layer 2a is improved. Furthermore, since a corner portion at the bottom of the second trench T2 is formed to be rounded off, the barrier metal 12d is attached to the inner surface of the second trench T2 continuously, and the crack is not generated at the corner portion. Thus, the function as the barrier metal 12d at the corner portion is not impaired. That is, the schottky diode having high barrier property can be obtained.

Hereinafter, the manufacturing method of the semiconductor device 107 will be described. In manufacturing the above-mentioned semiconductor device 107, the second trench T2 is formed in the n-conductive type semiconductor substrate 1 (accurately, the p-conductive type layer 2a) firstly by such as etching.

After forming the second trench T2 in the second trench forming process, in a removal process, a damage layer which is formed in vicinity of the second trench is removed by CDE. Specifically, the damage layer having approximately only 100 to 200 Å thickness is formed at the p-conductive type layer 2a. Hereby, only a portion having the same depth included in the p-conductive type layer 2a is removed from the inner surface of the second trench T2.

And then, as a barrier metal forming process, the barrier metal 12d is formed by sputtering method with respect to the n-conductive type semiconductor substrate 1 in an atmosphere set to be 350 degrees Celsius with use such as tungsten.

Eighth Embodiment

Figure 14:
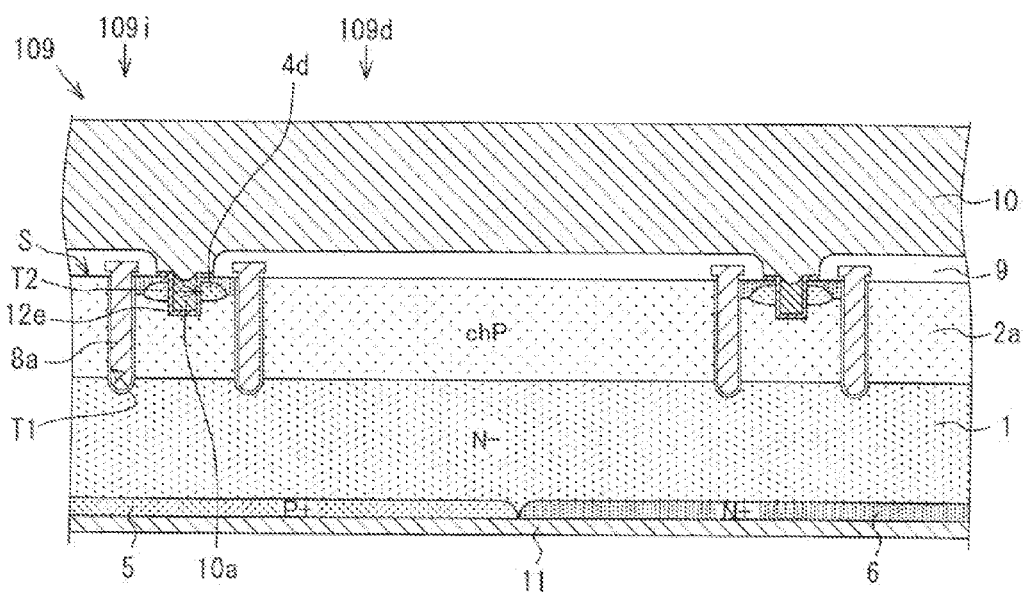
FIG. 14 shows a cross sectional side view of a semiconductor device according to an eighth embodiment.

Hereinafter, an eighth embodiment of a semiconductor device and a manufacturing method thereof will be described with reference to FIG. 14. FIG. 14 is a cross sectional side view showing a cross sectional side structure of a semiconductor device 109 according to the eighth embodiment. As shown in FIG. 14, the semiconductor device 109 of the present embodiment has a structure based on the semiconductor devices 104 to 107 shown in FIGS. 5A, 5B, 8A, 8B, 11 and 12, that is, a plurality of IGBT cells 109i and diode cells 109d are formed in the n-conductive type semiconductor substrate 1.

However, in the semiconductor device 109 of the present embodiment, metal having low electric resistance such as aluminum or the like is used as the material, which forms a portion over the main side S of the n-conductive type semiconductor substrate 1 of the second electrode layer 10. On the other hand, such as tungsten (W) which is easy to be embedded is used as the material forming a portion 10a of the second electrode layer 10, which is embedded in the second trench T2. Since tungsten (W) can be embedded in the corner portion of the second trench T2 absolutely, the portion 10a of the second electrode layer 10, which is embedded in the second trench T2, is an electrode having few cracks (slits) and voids (space).

Hereinafter, the manufacturing method of the semiconductor device 109 will be described. In manufacturing the above-mentioned semiconductor device 109, the second trench T2 is formed in the n-conductive type semiconductor substrate 1 (accurately, the p-conductive type layer 2a) firstly by such as etching.

After forming the second trench T2 in the second trench forming process, in a removal process, a damage layer which is formed in vicinity of the second trench is removed by COE. Specifically, the damage layer having approximately only 100 to 200 Å thickness is formed at the p-conductive type layer 2a. Hereby, only a portion having the same depth included in the p-conductive type layer 2a is removed from the inner surface of the second trench T2.

After removing the damage layer in the removal process, in a barrier metal forming process, a barrier metal 12e having approximately 1000 to 1500 Å thickness is formed by sputtering method with respect to a bottom and a sidewall of the second trench T2 in the n-conductive type semiconductor substrate 1. After forming the barrier metal 12e, thermal treatment may be performed in a nitrogen atmosphere set to be 900 to 1000 degrees Celsius. By performing the thermal treatment, a surface layer (not shown in the drawings) of the barrier metal 12e reacts with nitrogen to form titanium nitride (TiN). The titanium nitride (TiN) has a thickness about 100 Å. Hereby, the surface layer of the barrier metal 12e becomes dense and the barrier property as the barrier metal is improved.

After forming the barrier metal in the barrier metal forming process, in a electrode layer forming process, tungsten (W) is embedded in every corners of the second trench T2 (so-called a W plug). After tungsten (W) is embedded, tungsten (W) is planarized to adjust the main side S of the n-conductive type semiconductor substrate 1. In case that the planarization is performed, a top surface of the portion 10a embedded in the second trench T2 sags slightly. Hereby, after tungsten (W) is embedded in the second trench T2, the second electrode layer 10 is formed with the use of aluminum.

Ninth Embodiment

Figure 13:
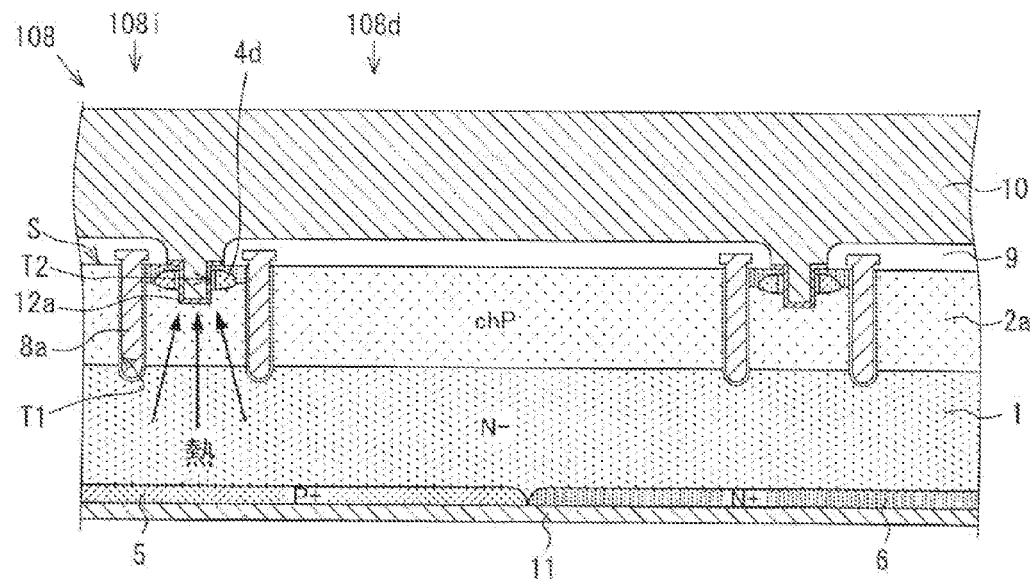
FIG. 13 shows a cross sectional side view of a semiconductor device according to a ninth embodiment.

Hereinafter, a ninth embodiment of a semiconductor device and a manufacturing method thereof will be described with reference to FIG. 13. FIG. 13 is a cross sectional side view showing a cross sectional side structure of a semiconductor device 108 according to the present embodiment. As shown in FIG. 13, the semiconductor device 108 of the present embodiment has a structure based on the semiconductor devices 104 to 107 and 109 shown in FIGS. 5A, 5B, 8A, 8B, 11, 12 and 14, that is, a plurality of IGBT cells 108l and diode cells 108d are formed in the n-conductive type semiconductor substrate 1.

However, as the semiconductor device 109 described in the eighth embodiment, in case that metal having low electric resistance such as aluminum or the like is used as the material which forms a portion over the main side S of the n-conductive type semiconductor substrate 1 of the second electrode layer 10. On the other hand, such as tungsten (W) which is easy to be embedded is used as the material forming a portion embedded in the second trench T2 of the second electrode layer 10, the problem may be caused as follows. Specifically, in such a structure, when load is short-circuited or when switching is performed during large current flows, current flows into the IGBT cell mainly, and the portion 10a of the second electrode layer 10 embedded in the second trench T2 generates heat. Due to the generating heat, property of the semiconductor device may be changed.

As shown in the semiconductor device 108 of the present embodiment or the above-mentioned semiconductor devices 104 to 107, as material forming a portion of the second electrode layer 10 embedded in the second trench T2, it is preferable to use metal such as aluminum or the like, which has large thermal conductivity (good heat release property). Hereby, heat radiation property is improved, and the short-circuit withstand property and the switching withstand property can be improved.

Although the fourth to ninth embodiments show the semiconductor devices 104 to 108, in which a plurality of IGBT cells including an embedded diode cell are formed in the semiconductor substrate, and the manufacturing methods thereof, the semiconductor devices may have other structures. For example, the semiconductor device in which the IGBT cell may be replaced by a trench type MOS transistor or a planar type MOS transistor, and manufacturing method thereof may be used.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A semiconductor device comprising:
an n-conductive type semiconductor substrate having a main side and a rear side, and including an IGBT cell and a diode cell;
a p-conductive type layer arranged over a main side surface portion of the n-conductive type semiconductor substrate and having an impurity concentration which decreases from the main side toward the rear side;
a main side n-conductive type region and a main side p-conductive type region arranged over a surface portion of the p-conductive type layer;
a rear side p-conductive type region and a rear side n-conductive type region arranged over a rear side surface portion of the n-conductive type semiconductor substrate;
a first trench which reaches the n-conductive type semiconductor substrate and penetrates the main side n-conductive type region and the p-conductive type layer;
a first electrode layer embedded in the first trench through an insulating film, and providing a gate electrode of the IGBT cell;
a second electrode layer arranged over the main side of the n-conductive type semiconductor substrate, electrically coupled with the main side n-conductive type region and the p-conductive type layer, and providing both an emitter electrode of the IGBT cell and an anode electrode of the diode cell;
a third electrode layer arranged over the rear side of the n-conductive type semiconductor substrate, electrically coupled with the rear side p-conductive type region and the rear side n-conductive type region, and providing both a collector electrode of the IGBT cell and a cathode electrode of the diode cell;
an exposed surface which is exposed at the main side of the n-conductive type semiconductor substrate and an unexposed surface which is not exposed at the main side of the n-conductive type semiconductor substrate in the main side p-conductive type region; and
a second trench which reaches an inside of the p-conductive type layer and penetrates the main side p-conductive type region,
wherein the second electrode layer is embedded in the second trench and the second electrode layer is electrically coupled with the unexposed surface of the main side p-conductive type region at a sidewall of the second trench,
wherein the second electrode layer is electrically coupled with the exposed surface of the main side p-conductive type region at the main side of the n-conductive type semiconductor substrate,
wherein the rear side p-conductive type region and the rear side n-conductive type region directly contact the rear side of the n-conductive type semiconductor substrate,
wherein the rear side p-conductive type region provides a collector of the IGBT cell,
wherein the rear side n-conductive type region provides a cathode of the diode cell,
wherein each of the main side n-conductive type region and the main side p-conductive type region has an impurity concentration higher than the impurity concentration of the p-conductive type layer,
wherein an impurity concentration of the main side p-conductive type region decreases from the main side toward the rear side,
wherein the impurity concentration in the main side p-conductive type region and the p-conductive type layer decreases from the main side toward the rear side,
wherein the main side p-conductive type region includes a first main side p-conductive type region and a second main side p-conductive type region,
the first main side p-conductive type region has both the exposed surface that is exposed at the main side of the n-conductive type semiconductor substrate and the unexposed surface that is not exposed at the main side of the n-conductive type semiconductor substrate, and the second main side p-conductive type region has only the unexposed surface that is not exposed at the main side of the n-conductive type semiconductor substrate.

2. The semiconductor device according to claim 1, wherein the first main side p-conductive type region and the second main side p-conductive type region are arranged alternately over the main side of the n-conductive type semiconductor substrate to have a rectangular planar shape.

3. A semiconductor device comprising:
a p-conductive type semiconductor substrate having a main side and a rear side, and including an IGBT cell and a diode cell;
an n-conductive type layer arranged over a main side surface portion of the p-conductive type semiconductor substrate and having an impurity concentration which decreases from the main side toward the rear side;
a main side p-conductive type region and a main side n-conductive type region arranged over a surface portion of the n-conductive type layer;
a rear side n-conductive type region and a rear side p-conductive type region arranged over a rear side surface portion of the p-conductive type semiconductor substrate;
a first trench which reaches the p-conductive type semiconductor substrate and penetrates the main side p-conductive type region and the n-conductive type layer;
a first electrode layer embedded in the first trench through an insulating film, and providing a gate electrode of the IGBT cell;
a second electrode layer arranged over the main side of the p-conductive type semiconductor substrate, electrically coupled with the main side p-conductive type region and the n-conductive type layer, and providing both an emitter electrode of the IGBT cell and an anode electrode of the diode cell;
a third electrode layer arranged over the rear side of the p-conductive type semiconductor substrate, electrically coupled with the rear side n-conductive type region and the rear side p-conductive type region, and providing both a collector electrode of the IGBT cell and a cathode electrode of the diode cell;
an exposed surface which is exposed at the main side of the p-conductive type semiconductor substrate and an unexposed surface which is not exposed at the main side of the p-conductive type semiconductor substrate in the main side n-conductive type region;
a second trench which reaches an inside of the n-conductive type layer and penetrates the main side n-conductive type region,
wherein the second electrode layer is embedded in the second trench and the second electrode layer is electrically coupled with the unexposed surface of the main side n-conductive type region at a sidewall of the second trench,
wherein the second electrode layer is electrically coupled with the exposed surface of the main side n-conductive type region at the main side of the p-conductive type semiconductor substrate,
wherein the rear side p-conductive type region and the rear side n-conductive type region directly contact the rear side of the p-conductive type semiconductor substrate,
wherein the rear side p-conductive type region provides a collector of the IGBT cell,
wherein the rear side n-conductive type region provides a cathode of the diode cell,
wherein each of the main side p-conductive type region and the main side n-conductive type region has an impurity concentration higher than the impurity concentration of the n-conductive type layer,
wherein an impurity concentration of the main side n-conductive type region decreases from the main side toward the rear side,
wherein the impurity concentration in the main side n-conductive type region and the n-conductive type layer decreases from the main side toward the rear side,
wherein the main side n-conductive type region includes a first main side n-conductive type region and a second main side n-conductive type region,
the first main side n-conductive type region has both the exposed surface that is exposed at the main side of the p-conductive type semiconductor substrate and the unexposed surface that is not exposed at the main side of the p-conductive type semiconductor substrate, and
the second main side n-conductive type region has only the unexposed surface that is not exposed at the main side of the p-conductive type semiconductor substrate.

4. The semiconductor device according to claim 3, wherein the first main side n-conductive type region and the second main side n-conductive type region are arranged alternately over the main side of the p-conductive type semiconductor substrate to have a rectangular planar shape.

* * * * *